United States Patent
Walther et al.

(10) Patent No.: US 9,828,237 B2
(45) Date of Patent: Nov. 28, 2017

(54) MEMS DEVICE AND MEMS VACUUM MICROPHONE

(71) Applicant: Infineon Technologies AG, Neubiberg (DE)

(72) Inventors: Arnaud Walther, Unterhaching (DE); Alfons Dehe, Reutlingen (DE); Johann Strasser, Schierling (DE); Gerhard Metzger-Brueckl, Geisenfeld (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 15/066,741

(22) Filed: Mar. 10, 2016

(65) Prior Publication Data

US 2017/0260040 A1    Sep. 14, 2017

(51) Int. Cl.
   *B81B 3/00*      (2006.01)
   *H04R 19/04*     (2006.01)

(52) U.S. Cl.
   CPC .......... *B81B 3/0086* (2013.01); *H04R 19/04* (2013.01); *B81B 2201/0257* (2013.01); *B81B 2203/0127* (2013.01); *H04R 2201/003* (2013.01)

(58) Field of Classification Search
   CPC ............ H04R 19/005; H04R 2201/003; H04R 31/00; H04R 19/04; H04R 17/00; H04R 17/02; H04R 19/016; H04R 19/02; H04R 1/00; H04R 1/005; H04R 1/08; H04R 2207/00; H04R 2231/00; H04R 23/00
   USPC ................. 257/416; 381/116, 174, 176, 191; 438/53
   See application file for complete search history.

(56) References Cited

U.S. PATENT DOCUMENTS

| | | | |
|---|---|---|---|
| 6,243,474 B1* | 6/2001 | Tai ....................... | H04R 19/016 29/594 |
| 9,181,080 B2 | 11/2015 | Dehe et al. | |
| 9,309,105 B2* | 4/2016 | Dehe ........................ | G01L 1/14 |
| 2006/0150739 A1* | 7/2006 | Yasuda .................. | G01H 11/06 73/654 |
| 2012/0148071 A1* | 6/2012 | Dehe ...................... | H04R 1/005 381/116 |
| 2013/0221453 A1 | 8/2013 | Dehe et al. | |
| 2015/0001647 A1* | 1/2015 | Dehe ..................... | B81B 3/0021 257/416 |
| 2015/0256913 A1* | 9/2015 | Dehe ....................... | H04R 1/08 381/176 |
| 2015/0289046 A1 | 10/2015 | Dehe et al. | |

* cited by examiner

*Primary Examiner* — Edward Chin
(74) *Attorney, Agent, or Firm* — Slater Matsil, LLP

(57) ABSTRACT

In accordance with an embodiment, a MEMS device includes a first membrane element, a second membrane element spaced apart from the first membrane element, a low pressure region between the first and second membrane elements, the low pressure region having a pressure less than an ambient pressure, and a counter electrode structure comprising a conductive layer, which is at least partially arranged in the low pressure region or extends in the low pressure region. The conductive layer includes a segmentation providing an electrical isolation between a first portion of the conductive layer and a second portion of the conductive layer.

30 Claims, 10 Drawing Sheets

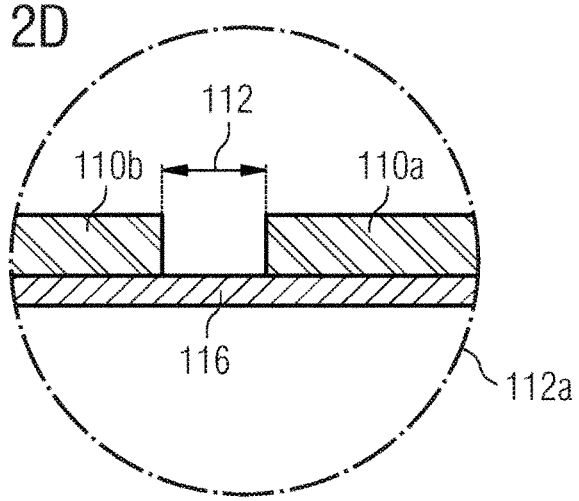
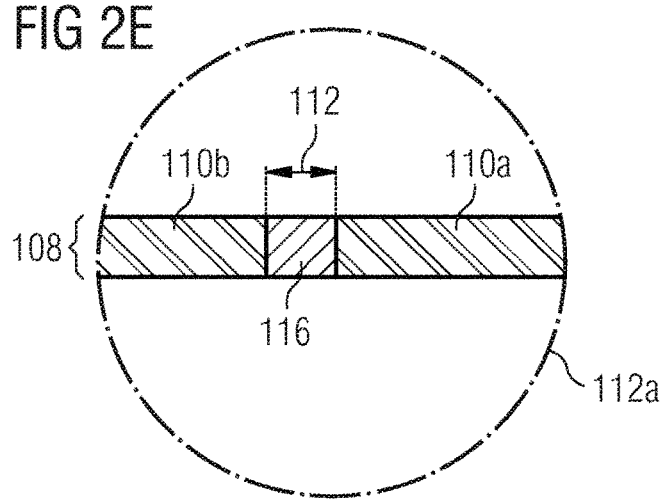

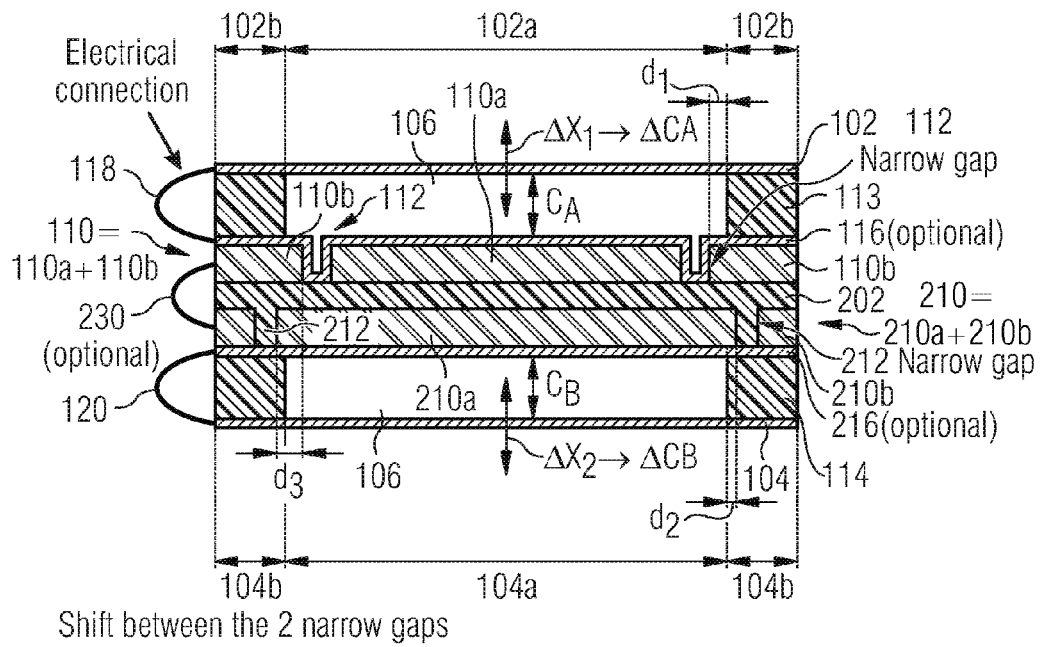
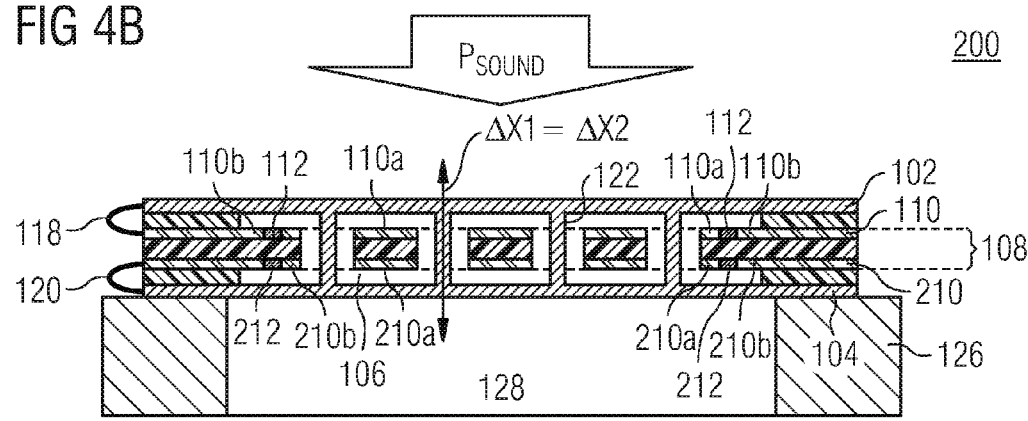

Lower parasitic capacitance at the level of first narrow gap compared to the case for which it is filled with oxide Shift between the narrow gaps: better for robustness but not too wide to limit parasitic capacitance at indicated location Scheme with remaining parasitic capacitance:

Shift inversion at the border of the electrode to balance remaining parasitic capacitances Sinus-like segmentation lines to avoid holes in the electrode

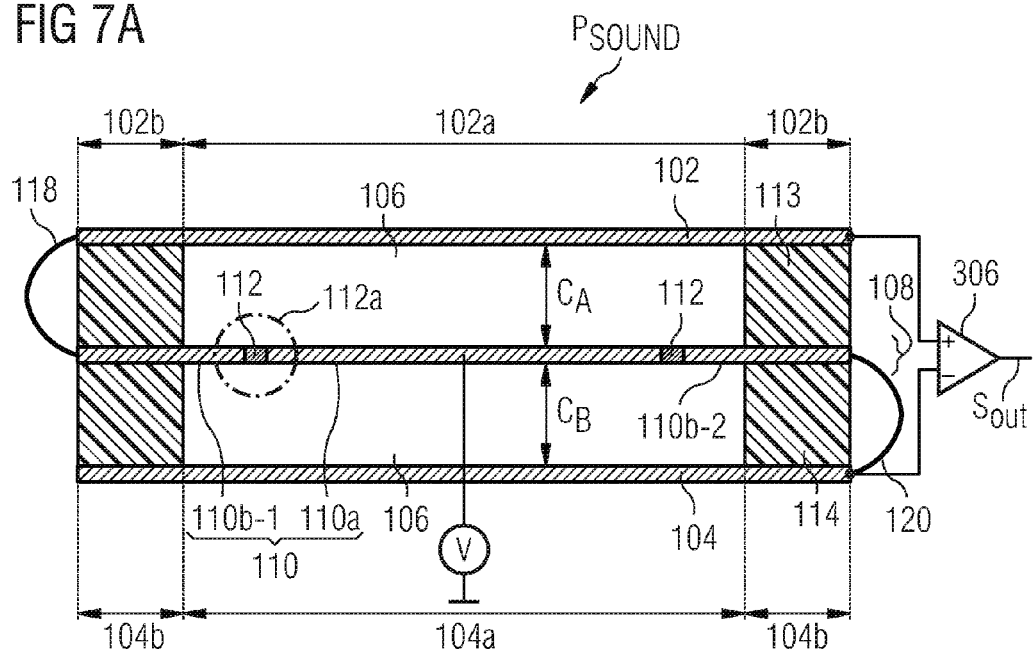
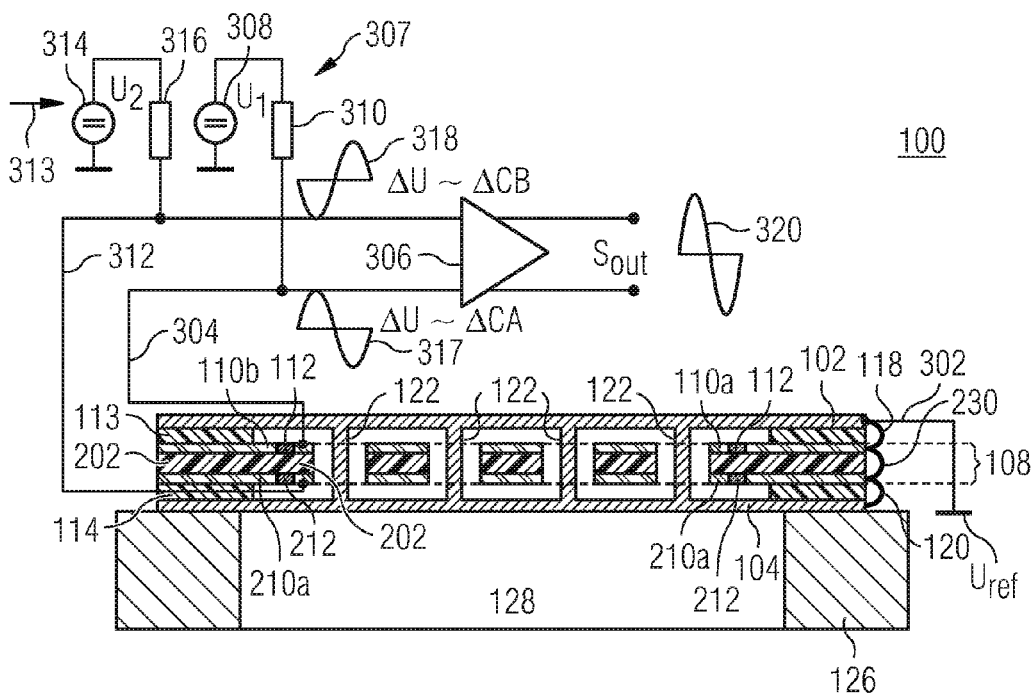

MEMS DEVICE AND MEMS VACUUM MICROPHONE

TECHNICAL FIELD

Embodiments of the invention relate to a microelectromechanical system (MEMS) device. Some embodiments relate to a MEMS microphone, a MEMS sound transducer. Some embodiments relate to a vacuum microphone and/or a vacuum speaker.

BACKGROUND

When designing transducers (e.g. sound transducers), such as pressure sensors, acceleration sensors, microphones, or loudspeakers, it may be typically desirable to achieve a high signal-to-noise ratio (SNR) of the transducer output signal. The continuous miniaturization of transducers may pose new challenges with respect to the desired high signal-to-noise ratio. Microphones and to some extent also loudspeakers, which may be used in, for example, mobile phones, laptops and similar (mobile or stationary) devices, may nowadays be implemented as semiconductor (silicon) microphones or microelectromechanical systems (MEMS). In order to be competitive and to provide the expected performance, silicon microphones may need high SNR of the microphone output signal. However, taking the capacitor microphone as an example, the SNR may be typically limited by the capacitor microphone construction and by the resulting parasitic capacitances.

Parasitic capacitances are usually unwanted capacitances interfering with capacitances between both the membrane and the counter electrode. Hence, capacitance values, intended to be transferred into electrical signals responsive to the movement of the membrane are interfered. In case the MEMS device is embodied as a double backplate microphone, for example, parasitic capacitances may influence the MEMS device such that the electrical output signal does not provide a sufficiently correct reproduction of the audible sound input signal, i.e. the arriving sound waves.

SUMMARY

An embodiment of the invention provides a MEMS device comprising a first membrane element, a second membrane element spaced apart from the first membrane element, a low pressure region between the first and second membrane elements, the low pressure region having a pressure less than an ambient pressure, and a counter electrode structure comprising a conductive layer, which is at least partially arranged in the low pressure region or extends in the low pressure region, wherein the conductive layer comprises a segmentation providing an electrical isolation between a first portion of the conductive layer and a second portion of the conductive layer.

A further embodiment provides a MEMS device comprising a first membrane element, a second membrane element spaced apart from the first membrane element, a low pressure region between the first and second membrane elements, the low pressure region having a pressure less than an ambient pressure, and a counter electrode structure comprising a conductive layer which is at least partially arranged in the low pressure region or extends in the low pressure region, wherein the first membrane element comprises a segmentation providing an electrical isolation between a first portion of the first membrane element and a second portion of the first membrane element, and wherein the second membrane element comprises a further segmentation comprising an electrical isolation between a first portion of the second membrane element and a second portion of the second membrane element.

BRIEF DESCRIPTION OF THE DRAWINGS

Embodiments of the present invention are described herein making reference to the appended drawings and figures.

FIGS. 2a-e show schematic partial cross-sections of the segmentation areas of the MEMS microphone of FIGS. 1a-b;

FIGS. 4a-b show schematic cross-sectional views of a vacuum MEMS microphone (MEMS loudspeaker or MEMS sound transducer) comprising a counter electrode structure having two segmented conductive layers;

FIGS. 7a-d show schematic circuit diagrams illustrating read out configurations for the MEMS device.

Figure 1A:
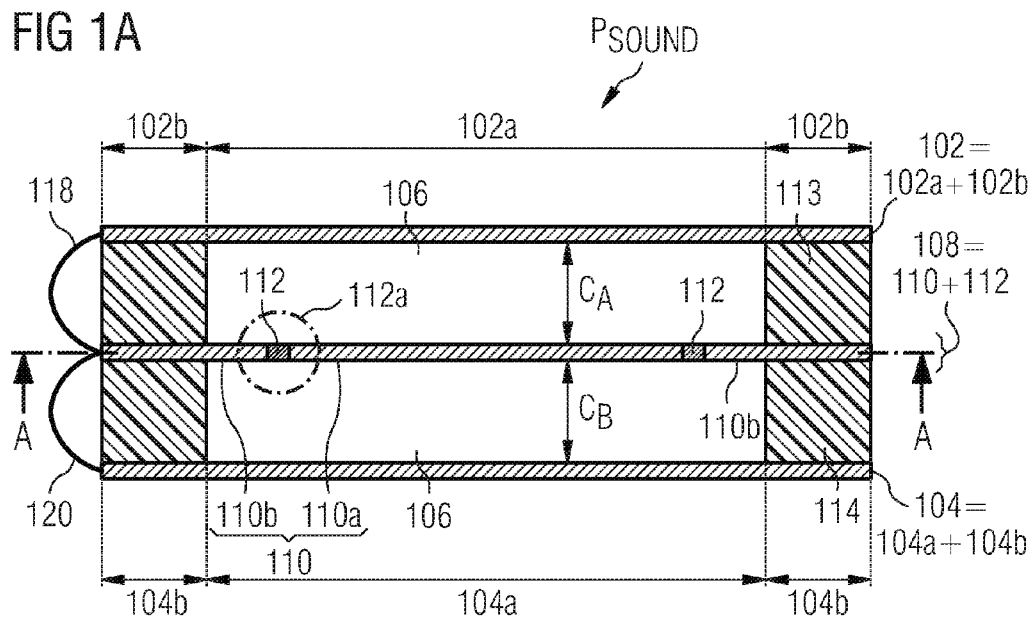
FIGS. 1a-b show a schematic cross-sectional view and a schematic plane view of a MEMS microphone comprising a segmented counter electrode structure.

Before discussing the present invention in further detail using the drawings, it is pointed out that in the figures and the specification identical elements and elements having the same functionality and/or the same technical or physical effect are usually provided with the same reference numbers or are identified with the same name, so that the description of these elements and of the functionality thereof as illustrated in the different embodiments are mutually exchangeable or may be applied to one another in the different embodiments.

DETAILED DESCRIPTION OF ILLUSTRATIVE EMBODIMENTS

In the following description, embodiments of the invention are discussed in detail, however, it should be appreciated that the invention provides many applicable inventive concepts that can be embodied in a wide variety of specific MEMS devices. The specific embodiments discussed are merely illustrative of specific ways to make and use the invention, and do not limit the scope of the invention. In the following description of embodiments, the same or similar elements having the same function have associated therewith the same reference signs or the same name, and a description of the such elements will not be repeated for every embodiment. Moreover, features of the different embodiments described hereinafter may be combined with each other, unless specifically noted otherwise.

In the following, embodiments will be described with respect to embodiments in the context of MEMS devices in general, wherein the following description may also be applied to any MEMS sound transducer, such as (vacuum) microphones or loudspeakers, pressure sensors, acceleration sensors, actuators, etc.

In various embodiments of present invention, parasitic capacitances are reduced or eliminated for a MEMS device, e.g. a microphone, with a low pressure region between the membrane (or diaphragm) as the movable structure, which motion is to be capacitively detected with a (e.g. static) backplate electrode (or counter electrode).

In accordance with some embodiments, a segmentation of the backplate electrode is conducted with the purpose to reduce the parasitic capacitance in order to improve performance of the microphone. To be more specific, the signal-to-noise ratio (SNR) of a microphone is reduced by a factor $$k \sim \frac{1}{1+C_0/C_P},$$

wherein $C_0$ is the useful capacitance and $C_p$ is the parasitic capacitance of the microphone. Thus, given a useful capacitance $C_0$, a reduced parasitic capacitance $C_P$ results in reduced factor k and, thus, in an increased SNR of the transducer output signal.

According to embodiments, the parasitic capacitance for a MEMS microphone, such as a vacuum microphone, can be reduced, while maintaining high mechanical robustness. The static electrode of a vacuum microphone is made of a (first) conductive layer, which is split in an outer part and an inner part through a (first) narrow gap, wherein an insulating layer may be formed on top of the conductive layer. The outer part of the conductive layer may be electrically connected to the movable structure (i.e. the membrane or diaphragm). In case, the static electrode comprises a further (second) conductive layer, this conductive layer is also split in an inner part and an outer part by means of a further (second) narrow gap. In this case, the first and second narrow gaps are preferably shifted or offset one from another so that they do not overlap with respect to a vertical projection to the main surface of the backplate electrode. The outer parts of the two conductive layers may be electrically connected to the movable structure, which motion is to be capacitively detected with the backplate electrode.

As a variant, the segmentation can alternatively or additionally be applied to the movable structure, i.e. the movable membrane(s) or diaphragm(s). The outer part of the membrane(s) may be electrically connected to the backplate structure.

Figure 1B:
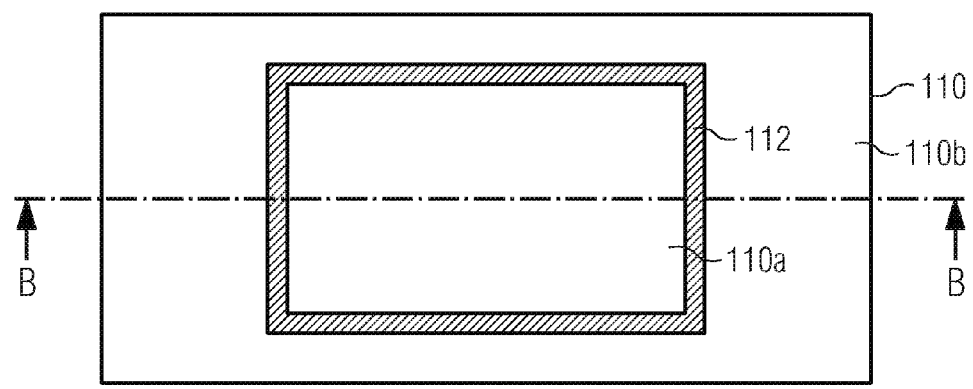

FIGS. 1a-b show a schematic cross-sectional view and a schematic plane view of a MEMS microphone comprising a segmented counter electrode structure. FIG. 1b shows a plane view of the MEMS device 100 of FIG. 1a with respect to the intersection plane as indicated by the dashed line "AA" in FIG. 1a. The dashed line "BB" in FIG. 1b indicates the intersection plane of the cross-sectional view of FIG. 1a.

FIG. 1a-b schematically illustrate a concept for a MEMS device 100, e.g. a vacuum MEMS microphone, which comprises a first membrane (or diaphragm) element 102, a second membrane (or diaphragm) element 104, which is spaced apart from the first membrane element 102. A low pressure region 106, e.g. a vacuum region or near-vacuum region, is located between the first membrane element 102 and the second membrane element 104, wherein the low pressure region 106 has a (gas) pressure less than an ambient pressure. A counter electrode structure (or backplate structure) comprises (at least one) conductive layer 110, which is at least partially arranged in the low pressure region 106 or extends in the low pressure region 106. The conductive layer comprises a segmentation 112 which provides an electrical insulation between a first portion 110a of the conductive layer 110 and a second portion 110b of the conductive layer 110.

In order to allow to differentially read out the MEMS device 100 the outer part 110b may comprise two electrically isolated portions 110b-1, 110b-2. Thus, the electrically isolated outer parts 110b-1, 110b-2 of the single conductive layer are respectively electrically connected to one of the movable membrane elements 102, 104 to avoid a shorting of the two membrane elements 102, 104. By biasing the inner part 110a of the counter electrode 110, the two membrane elements 102, 104 can be differentially read out, for example.

As indicated above, the counter electrode structure 108 may comprise at least one conductive layer 110, wherein the following description with respect to FIGS. 1a-b, 2a-e and 3a-c relates to a counter electrode structure comprising, for example, one conductive layer, wherein the following explanations are equally applicable to an arrangement having a counter electrode structure with two electrically isolated/insulated conductive layers, for example.

As further shown in FIG. 1a, (optional) spacer elements 113, 114 may be arranged between the first membrane element 102 and the counter electrode structure 108 and between the second membrane element 104 and the counter electrode structure 108 for holding the first and second membrane elements 102, 104 in a predefined distance from the counter electrode structure 108.

As it is also shown in FIG. 1a, the first membrane element 102 comprises a displaceable (movable) portion 102a and a fixed portion 102b, and wherein the second membrane element 104 comprises a displaceable or movable portion 104a and a fixed portion 104b. The fixed portion 102b of the first membrane element 102 is, for example, mechanically connected to the first spacer element 113, wherein the fixed portion 104b of the second membrane element 104 is mechanically connected (attached) to the second spacer 114. Moreover, the counter electrode structure 108 is, for example, fixed (sandwiched) between the first and second spacer elements 113, 114. Thus, the first portion 110a of the conductive layer 110 is arranged between the displaceable portion 102a of the first membrane element 102 and the displaceable portion 104a of the second membrane element 104.

Thus, the first portion 110a of the conductive layer 110 is a middle or center portion of the conductive layer, wherein the second portion 110b of the conductive layer 110 is a fringe or edge portion of the conductive layer 110. Thus, the middle or central portion 110a may be regarded as the "electrically active" portion of the conductive layer 110 and contributes to the useful capacitance C0 and, thus, to the useful signal component of the sensor output signal.

Thus, variable active capacitances CA and CB, which form in combination the useful capacitance C0, are respectively formed. The variable active capacitance CA is formed between the displaceable portion 102a of the first membrane element 102 and the counter electrode structure 108 (i.e. the first portion 110a of the conductive layer 110), wherein the variable active capacitances CB is formed between the displaceable portion 104a of the second membrane element 104 and the counter electrode structure 108 (i.e. the first portion 110a of the conductive layer 110).

As optionally shown in FIG. 1a, the second portion 110b of the conductive layer 110 may be electrically coupled by means of a first connection element 118 to the first membrane element 102, and by means of a second connection element 120 to the second membrane element 104. The first and second membrane elements 102, 104 may be mechanically coupled. Further, the first and second membrane elements 102, 104 may also be electrically coupled or may be electrically decoupled (insulated).

The (optional) mechanical coupling of the first or second membrane elements 102, 104 results in a configuration wherein a displacement of one of the first and second membrane elements 102, 104 also leads, due to the mechanical coupling, to a corresponding displacement of the other membrane element. Thus, the displacement of the first and second membrane elements 102, 104 takes place "in parallel".

The low pressure region 106 is located within a sealed cavity, which is formed between the first and second membrane elements 102, 104. To be more specific, the sealed cavity may be confined by the first and second membrane elements 102, 104 and the first and second spacer elements 113, 114. The pressure in the lower pressure region 106 is substantially vacuum or near to vacuum.

As is schematically shown above, the first membrane element 102 (and/or the second membrane element 104) may be exposed to an ambient pressure and potentially a sound pressure PSOUND. This side of the membrane element may also be regarded as a sound receiving main surface of the MEMS device 100. A displacement of the first membrane element 102 may also result in a corresponding displacement of the second membrane element 104, if mechanically coupled. The low pressure region 106 may have a pressure that may be typically less than an ambient pressure or a standard atmospheric pressure.

To be more specific, according to an embodiment, the pressure in the low pressure region may be substantially a vacuum or a near-vacuum. Alternatively, the pressure in the low pressure region may be less than about 50% (or 40%, 25%, 10% or 1%) of the ambient pressure or the standard atmospheric pressure. The standard atmospheric pressure may be typically 101.325 kPa or 1013.25 mbar. The pressure in the low pressure region may also be expressed as an absolute pressure, for example less than 50, 40, 30 or less than 10 kPa.

FIG. 1b shows an exemplary illustration in the form of a plane view of the MEMS device 100 of FIG. 1a with respect to the intersection plane as indicated by the dashed line "AA" in FIG. 1a. The dashed line "BB" in FIG. 1b indicates the intersection plane of the cross-sectional view of FIG. 1a.

As illustrated in FIG. 1b, the first and second membrane elements 102, 104, the counter electrode structure 108 and the segmentation 112 are illustrated, only by way of example, as having a square form. Alternatively, these elements may comprise also a circular circumferential form or any other geometrically suitable (polygonal) circumferential form or design.

As exemplarily shown in FIG. 1b, the segmentation 112 (segmentation element) of the conductive layer 110 is a circumferential narrow gap or recess (e.g. in the form of a segmentation groove) in the conductive layer 110.

Thus, FIGS. 1a-b show the MEMS device 100, e.g. a MEMS vacuum microphone, comprising a segmented counter electrode structure 108, i.e. the counter electrode structure comprises the segmented conductive layer 110. The segmentation 112 of the conductive layer 110 may be arranged to provide an electrical isolation between the first ("active") portion 110a of the conductive layer 110 and the second (substantially "inactive") portion 110b of the conductive layer 110.

The variable active capacitances CA and CB are observed between the displaceable portion 102a of the first membrane 102 and the first (active) portion 110a of the conductive layer 10 and between the displaceable portion 104a of the second membrane 104 and the first (active) portion 110a of the conductive layer 110. Hence, the active capacitances CA and CB vary in relation to the movement of the displaceable portions 102a, 104a of the first and second membrane elements 102, 104 in relation to the counter electrode structure 108 comprising the conductive layer 110, wherein the movement of displacement of the first and second membrane elements 102, 104 is generated by, for example, sound pressure changes PSOUND caused by speech, music, etc. in the environment.

In case of the MEMS device 100 of FIGS. 1a-b, the first and second membrane elements 102, 104 and the counter electrode structure 108 may have a rectangular shape, wherein also the segmentation 112 in the form of the circumferential narrow gap/recess, i.e. the segmentation groove 112, may also comprise a rectangular circumferential shape, for example. However, in another configuration, the first and second membrane elements 102, 104 and the counter electrode structure 108 may also have a circular shape, wherein also the segmentation may be formed circularly. However, it should become clear that independent from the shape of the first and second membrane elements 102, 104 and/or the counter electrode structure 108, the circumferential narrow gap 112 in the conductive layer 110 may have any appropriate (circular, rectangular, (nearly-closed) polygonal) circumferential shape. The (at least one) conductive layer 110 of the counter electrode structure 108 may be made of, or may comprise, an electrically conductive material, for example, poly-silicon or any metallization. By the provision of the segmentation of the counter electrode structure 108, the parasitic capacitances may be reduced greatly, since the separated and insulated second (inactive) portion 110b of the conductive layer 110, which may be electrically connected to the first and second membrane elements, respectively, do not (or at least in a very reduced way) contribute to the creation of parasitic capacitances CP. Hence, the capacitance of the MEMS device 100 may comprise the active capacitance CA created between the displaceable portion 102a of the first membrane element 102 and the first portion 110a of the conductive layer 110, as well as the further active capacitance CB between the displaceable portion 104a of the second membrane element 104 and the counter electrode structure 108, i.e. the first portion 110a of the conductive layer 110.

Based on this approach, any (still remaining) parasitic capacitances CP may be essentially eliminated or at least substantially reduced.

FIGS. 2a-e now provide, in an exemplary form, several enlarged illustrations of the segmentation 112 as indicated by the dashed circle 112a in FIG. 1a.

Figure 2A:
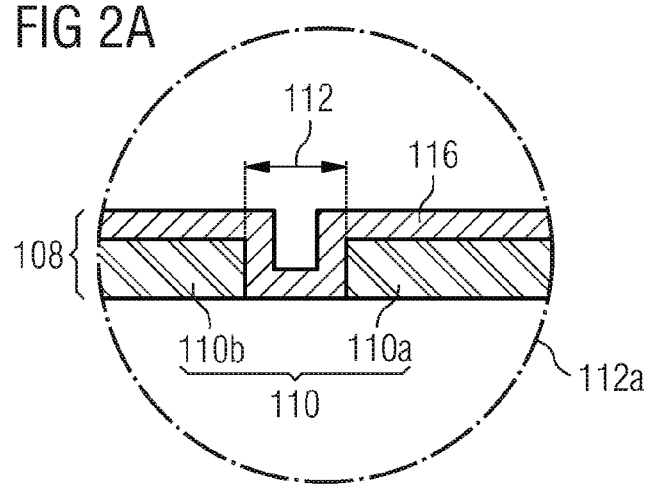

FIG. 2a shows a configuration wherein the conductive layer 110 is covered (at least in the area adjacent to the segmentation 112) by an isolation layer 116, wherein the gap 112 in the conductive layer 110 is at least partially filled with the material of the insulation layer 116 so that an electrical isolation between the first portion 110a and the second portion 110b of the conductive layer 110 is provided.

Figure 2B:
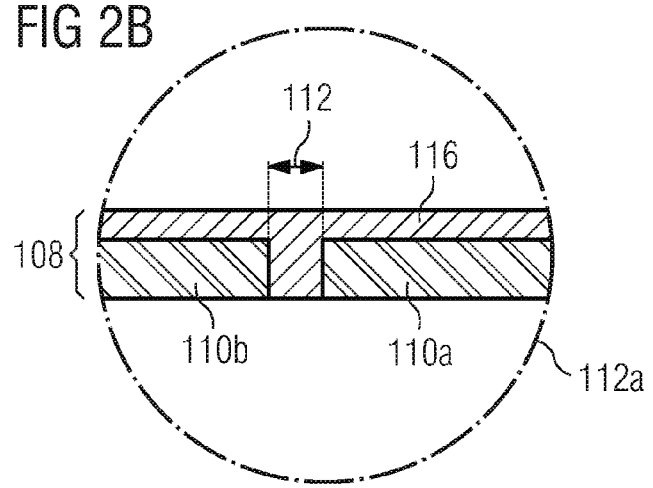

FIG. 2b shows a configuration of the segmentation 112, wherein the gap 112 between the first and second portions 110a, 110b of the conductive layer 110 is completely filled with the material of the isolation layer 116.

Figure 2C:
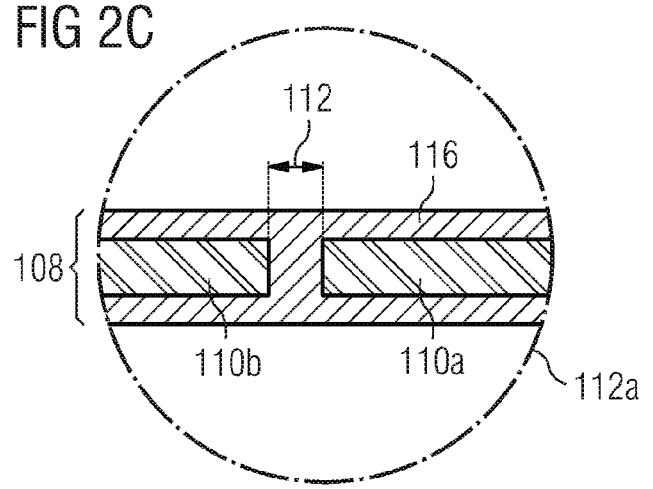

FIG. 2c shows a configuration of the segmentation 112, wherein the gap 112 between the first and second portions 110a, 110b of the conductive layer 110 is completely filled with the material of the isolation layer 116, and wherein the conductive layer 110 is (at least in the area adjacent to the segmentation 112) completely embedded within the material of the isolation layer 116.

FIG. 2d shows a configuration where isolation layer 116 covers (at least in the area adjacent to the segmentation 112) the conductive layer 110, i.e. the first and second portions 110a, 110b, wherein the gap 112 between the first and second portions 110a, 110b of the conductive layer 110 is free of any isolating material (i.e. does not comprise any isolating material) of the isolation layer 116.

FIG. 2e shows a configuration, wherein (only) the gap 112 between the first and second portions 110a, 110b of the conductive layer 110 is filled with an insulating material forming the segmentation 112 providing the electrical insulation between the first and second portions 110a, 110b of the conductive layer 110.

As shown in FIGS. 2a-d, the isolation layer 116 (isolation support or isolation support layer 116) may be disposed (at least in the area adjacent to the segmentation 112) on the conductive layer 110, i.e. the first and second portions 110a, 110b of the conductive layer 110. The isolation layer 116 may be disposed over the entire area of the conductive layer 110 or only over a portion or different sections of the conductive layer 110. The isolation layer 116 may be disposed on the surface area of the conductive layer 110 facing the first membrane element 102 or may be disposed on the surface area facing the second membrane element 104. The isolation layer 116 may comprise silicon dioxide, silicon nitride, high-k dielectric such as silicon oxynitride, a polyamide or a combination thereof.

As shown above, the first portion 110a and the second portion 110b of the conductive layer 110 may be isolated from each other with an isolation gap or isolation groove containing at least partially the isolation material of the isolation layer 116. To be more specific, the segmentation groove 112 may be filled with a dielectric material, such as silicon dioxide, silicon nitride or a high-k dielectric material such as silicon oxynitride.

As shown in FIG. 2e, the gap between first and second portions 110a, 110b of the conductive layer 110 may be filled with an ambient fluid or gas, e.g. air.

Figure 3A:
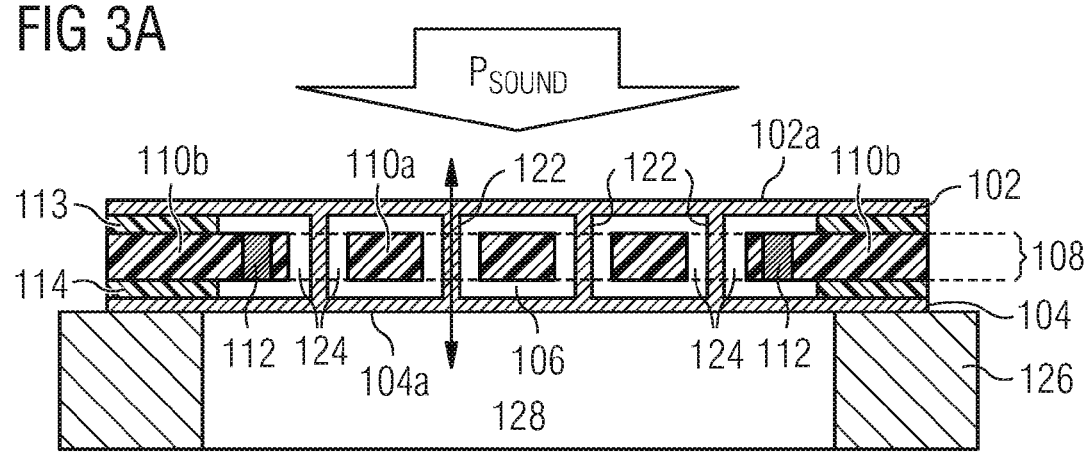
FIG. 3a-c shows schematic cross-sectional views of a vacuum MEMS microphone (MEMS loudspeaker or MEMS sound transducer) comprising a segmented counter electrode structure in different operation conditions.
Figure 3B:
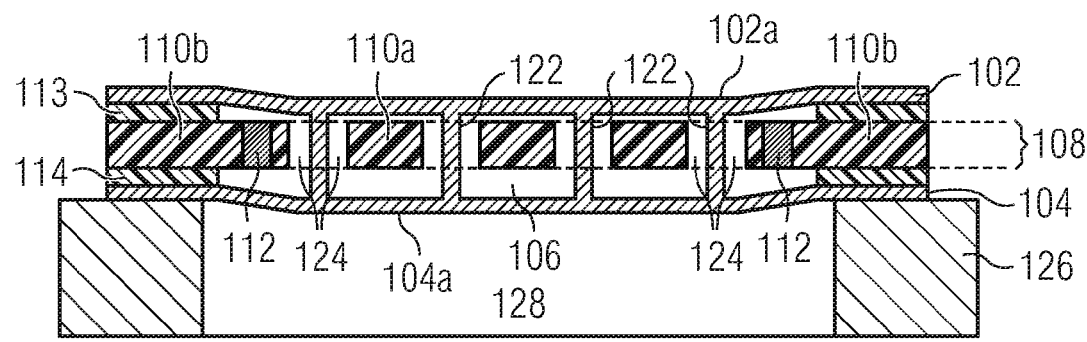
Figure 3C:
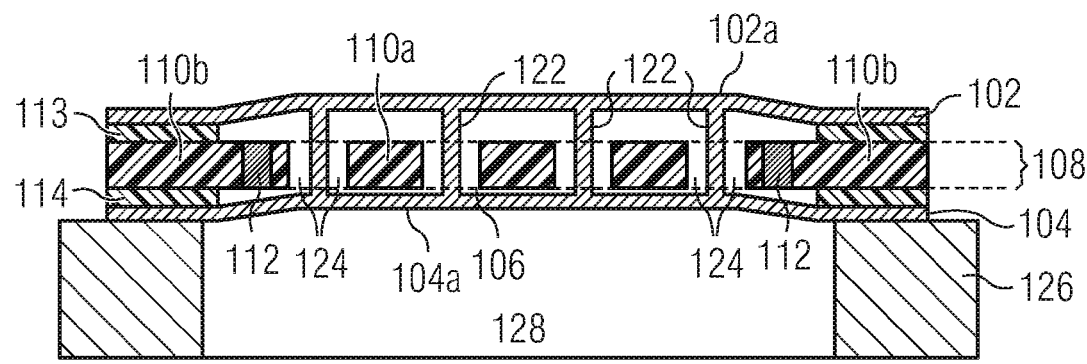

FIGS. 3a-c show schematic cross-sectional views of a vacuum MEMS microphone (MEMS loudspeaker or MEMS sound transducer) 100 comprising a segmented counter electrode structure 108 in different operation conditions for explaining the functionality thereof.

As shown in FIG. 3a, one or more pillars (columns or struts) 122 are mechanically coupling the first membrane element 102 and the second membrane element 104. To be more specific, the at least one pillar 122 is mechanically coupled between the displaceable portion 102a of the first membrane element 102 and the displaceable portion 104a of the second membrane element 104.

In case the one or more pillars are electrically conductive, they provide a mechanical and electrical coupling between the first and second membrane elements 102, 104. In case the one or more pillars are electrically insulating, they provide a mechanical coupling and an electrical decoupling between the first and second membrane elements 102, 104.

The pillars (columns or struts) 122 typically do not contact or touch the counter electrode structure 108, but rather may pass through the counter electrode structure 108, i.e. the (at least one) conductive layer 110, via openings or holes 124 in the counter electrode structure 108. In the implementation example schematically illustrated in FIG. 3a, the pillars 122 may be integrally formed with the first and second membrane elements 102, 104. Hence, the first membrane element 102, the second membrane element 104, and the pillars 122 may form an integral structure of the same material, for example polycrystalline silicon (polysilicon). Nevertheless, this does not mean that the first membrane element 102, the second membrane element 104, and the pillars 122 need to be formed concurrently during manufacture of the MEMS device 100. Rather, it may be possible that the second membrane element 104 may be formed first on a surface of a substrate 126 (or on a surface of an auxiliary layer such as an etch stop layer) during a (first) deposition process. Subsequently, the pillars 122 and eventually also the first membrane element 102 may be formed during a subsequent (second) deposition process and possibly during a further subsequent (third) deposition process. In alternative implementation examples, the pillars 122 may be of a different material than the first and second membrane elements 102, 104. The first diaphragm element 102 may have a main surface that may face the direction of a arrival of a sound. A recess or hole 128 in the substrate 126 forms the backside cavity 128 adjacent to the second membrane element 104.

Note that although the three central portions of the counter electrode structure 108 as depicted in FIG. FIGS. 3a-c appear to be "floating" within the low pressure region 106, they may be typically attached to the circumference of the counter electrode structure above and/or beneath the drawing plane of FIGS. 3a-c, as indicated by the dashed lines.

FIG. 3a shows the MEMS device 100 (MEMS microphone) at its rest position, e.g. when no sound wave arrives at the membrane elements 102, 104, which would cause the membrane elements 102, 104 to be deflected or displaced. FIGS. 3b and 3c show schematic cross-sectional views through the exemplary MEMS device 100, wherein the same may be exposed to an arriving sound pressure PSOUND. FIG. 3b shows the situation in which the membrane arrangement comprising the first and second membrane elements 102, 104 and the pillars 122 may be pushed down due to a relative overpressure caused by the sound at the upper side adjacent to the first membrane element 102 compared to the reference pressure within the backside cavity 128. In FIG. 3c, the pressure at the sound receiving side may be lower than the pressure within the backside cavity 128 so that the membrane arrangement 102, 104, 122 may be deflected upwards. Accordingly, the membrane structure moves up and down with respect to the counter electrode structure (the stator) 108 under an arriving sound signal PSOUND.

As an implementation option, the membrane arrangement 102, 104, 122 may comprise a so-called ventilation hole (not shown in FIGS. 3a-c) for a static pressure equalization between the ambient atmosphere and the backside cavity 128. The optional ventilation hole may have a rectangular (or square) cross-section or a circular cross-section, e.g. in the middle of the membrane arrangement. Thus, such a ventilation hole may be configured to facilitate the static pressure equalization between the ambient pressure and the backside cavity 128. Moreover, as a further option, a plurality of ventilation holes may be arranged in the membrane arrangement.

FIGS. 4a-b show schematic cross-sectional views of a further MEMS device 200, e.g. a MEMS sound transducer in the form of a vacuum MEMS microphone or MEMS loudspeaker, comprising a segmented counter electrode structure 108 having two segmented conductive layers, i.e. the first segmented conductive layer 110 and the second segmented conductive layer 210.

As shown in FIG. 4a, the counter electrode structure 108 comprises the (first) conductive layer 110 and a further (a second) conductive layer 210, wherein the second conductive layer 210 is electrically isolated from the first conductive layer 110. A further segmentation 212 provides an electrical isolation between a first portion 210a of the second conductive layer 210 and a second portion 210b of the second conductive layer 210. Furthermore, an insulating layer 202 may be arranged between the first and second conductive layers 110, 210 of the counter electrode structure 108 for providing an insulation and separation of the further portions 110a, 210a of the first and second conductive layers 110, 210.

The further segmentation 212, the segmentation of the second conductive layer 210, is also a circumferential narrow gap (second narrow gap) in the second conductive layer 210.

As further shown in FIG. 4a, (optional) spacer elements 113, 114 may be arranged between the first membrane element 102 and the counter electrode structure 108 and between the second membrane element 104 and the counter electrode structure 108 for holding the first and second membrane elements 102, 104 in a predefined distance from the counter electrode structure 108.

As it is also shown in FIG. 4a, the first membrane element 102 comprises a displaceable (movable) portion 102a and a fixed portion 102b, and wherein the second membrane element 104 comprises a displaceable or movable portion 104a and a fixed portion 104b. The fixed portion 102b of the first membrane element 102 is, for example, mechanically connected to the first spacer element 113, wherein the fixed portion 104b of the second membrane element 104 is mechanically connected (attached) to the second spacer 114. Moreover, the counter electrode structure 108 is, for example, fixed (sandwiched) between the first and second spacer elements 113, 114. Thus, the first portion 110a of the first conductive layer 110 is arranged between the displaceable portion 102a of the first membrane element 102 and the displaceable portion 104a of the second membrane element 104.

Thus, the first portion 110a of the first conductive layer 110 is a center or middle portion of the conductive layer, wherein the second portion 110b of the first conductive layer 110 is a fringe portion of the conductive layer 110. Thus, the center portion 110a may be regarded as the "electrically active" portion of the first conductive layer 110 and contributes to the useful capacitance C0 and, thus, to the useful signal component of the sensor output signal. Furthermore, the first portion 210a of the second conductive layer 110 is a center or middle portion of the second conductive layer 210, wherein the second portion 210b of the second conductive layer 210 is a fringe portion of the second conductive layer 210. Thus, the middle portion 210a may be regarded as the "electrically active" portion of the conductive layer 210 and contributes to the useful capacitance C0 and, thus, to the useful signal component of the sensor output signal Thus, variable active capacitances CA and CB, which form in combination the useful capacitance C0, are respectively formed. The variable active capacitance CA is formed between the displaceable portion 102a of the first membrane element 102 and the counter electrode structure 108 (i.e. the first portion 110a of the first conductive layer 110), wherein the variable active capacitances CB is formed between the displaceable portion 104a of the second membrane element 104 and the counter electrode structure 108 (i.e. the first portion 210a of the second conductive layer 210).

As optionally shown in FIG. 4a, the second portion 110b of the first conductive layer 110 may be electrically coupled by means of a first connection element 118 to the first membrane element 102, wherein the second portion 210b of the second conductive layer 210 may be electrically coupled by means of a second connection element 120 to the second membrane element 104. The first and second membrane elements 102, 104 may be mechanically coupled. Further, the first and second membrane elements 102, 104 may also be electrically coupled or may be electrically decoupled (insulated).

Moreover, an optional electrical connection 230 may be provided for electrically connecting the second portions 110b and 210b of the first and second conductive layers 110, 210.

The (optional) mechanical coupling of the first or second membrane elements 102, 104 results in a configuration wherein a displacement of one of the first and second membrane elements 102, 104 also leads, due to the mechanical coupling, to a corresponding displacement of the other membrane element. Thus, the displacement of the first and second membrane elements 102, 104 takes place (essentially) "in parallel".

The low pressure region 106 is located within a sealed cavity, which is formed between the first and second membrane elements 102, 104. To be more specific, the sealed cavity may be confined by the first and second membrane elements 102, 104 and the first and second spacer elements 113, 114. The pressure in the lower pressure region 106 is substantially vacuum or near to vacuum.

As is schematically shown above, the first membrane element 102 (and/or the second membrane element 104) may be exposed to an ambient pressure and potentially a sound pressure PSOUND. This side of the membrane element may also be regarded as a sound receiving main surface of the MEMS device 100. A displacement of the first membrane element 102 may also result in a corresponding displacement of the second membrane element 104, if mechanically coupled. The low pressure region 106 may have a pressure that may be typically less than an ambient pressure or a standard atmospheric pressure.

As exemplarily shown in FIG. 4a, the segmentations 112, 212 (segmentation element) of the first and the second conductive layer 110, 210 are circumferential narrow gaps or recesses (e.g. in the form of a segmentation groove) in the respective first and second conductive layer 110, 210.

The variable active capacitances CA and CB are observed between the displaceable portion 102a of the first membrane 102 and the first (active) portion 110a of the first conductive layer 10 and between the displaceable portion 104a of the second membrane 104 and the first (active) portion 210a of the second conductive layer 210. Hence, the active capacitances CA and CB vary in form of capacitance variations $\Delta CA$ and $\Delta CB$ based on the movement $\Delta x1$, $\Delta x2$ of the displaceable portion 102a, 104a of the first and second membrane elements 102, 104 in relation to the counter electrode structure 108 comprising the conductive layers 110, 210, wherein the movement or displacement $\Delta x1$, $\Delta x2$ of the first and second membrane elements 102, 104 is generated, for example, by sound pressure changes PSOUND caused by speech, music, etc.

In case of the MEMS device 100 of FIGS. 4a-b, the first and second membrane elements 102, 104 and the counter electrode structure 108 may have a rectangular shape, wherein also the segmentations 112, 212 in the form of the circumferential narrow gap/recess, i.e. the segmentation grooves 112, 212, may also comprise a rectangular shape. However, it should become clear that the first and second membrane elements 102, 104 and the counter electrode structure 108 may have a circular shape, wherein also the segmentation may be formed circularly. However, it should become clear that independent from the shape of the first and second membrane elements and/or the counter electrode structure 108, the circumferential narrow gap in the first conductive layer 110 and the second conductive layer 210 may have any appropriate (circular, rectangular, (nearly-closed) polygonal) circumferential shape. The (at least one) conductive layer 110 of the counter electrode structure 108 may be made of, or may comprise, an electrically conductive material, for example, poly-silicon or any metallization. By the provision of the segmentation of the counter electrode structure 108, the parasitic capacitances may be reduced greatly, since the separated and insulated second (inactive) portion 110b of the first conductive layer 110 and the second (inactive) portion 210b of the second conductive layer 210, which may be electrically connected to the first and second membrane elements, respectively, do not (or at least in a very reduced way) contribute to the creation of parasitic capacitances. Hence, the capacitance of the MEMS device 100 as a whole may comprise the active capacitance CA created between the displaceable portion 102a of the first membrane element 102 and the counter electrode structure 108, i.e. the first portion 110a of the first conductive layer 110, as well as the further active capacitance CB between the displaceable portion 104a of the second membrane element 104 and the counter electrode structure 108, i.e. the first portion 210a of the second conductive layer 210.

Based on this approach, the (still remaining) parasitic capacitances CP may be essentially eliminated or at least substantially reduced.

As indicated above, the counter electrode structure 108 of the MEMS device 200 may comprise two conductive layers 110, 210, wherein the above description with respect to FIGS. 2a-e, which relates to a counter electrode structure comprising, for example, one conductive layer, is also equally applicable to the second conductive layer 210 (and the further isolation layer 216) of the MEMS device 200.

Thus, the further isolation layer 216 may be disposed on the surface area of the second conductive layer 210 facing the second membrane element 104, for example. The isolation layer 216 may comprise silicon dioxide, silicon nitride, high-k dielectric such as silicon oxynitride, a polyamide or a combination thereof.

As exemplarily shown in FIG. 4a, the second narrow gap 212 in the second conductive layer 210 is filled with an isolating material. However, further optional implementations with respect to the first narrow gap 112 and the second narrow gap 212 are exemplarily illustrated with respect to FIGS. 5a and 5b below.

The first portion 210a of the second conductive layer 210 is a center or central portion of the second conductive layer 210, wherein the second portion 210b of the second conductive layer 210 is a fringe or edge portion of the second conductive layer. The first membrane element 102 comprises the displaceable portion 102a and the fixed portion 102b, wherein the second membrane element 104 comprises the displaceable portion 104a and the fixed portion 104b. Thus, the first portion 110a of the first conductive layer 110 faces the displaceable portion 102a of the first membrane element 102, and wherein the first portion 210a of the second conductive layer 210 faces the displaceable portion 104a of the second membrane element 104. Moreover, a first spacer 113 (first spacer element) is arranged between the first membrane element 102 and the first conductive layer 110, wherein a second spacer 114 (second spacer element) is arranged between the second membrane element 104 and the second conductive layer 210 at a respective fringe portion thereof. As shown in FIG. 4a, the circumferential narrow gap 112 in the first conductive layer 110 is located (with respect to a vertical projection) outside the first spacer element 113, wherein the circumferential gap 112 in the second conductive layer 210 is, with respect to a vertical projection, located inside the second spacer element 114. However, this configuration of the first and second narrow gaps 112 and 212 is merely an exemplary implementation, wherein based on the necessary structural robustness of the counter electrode structure 108, the relative position of the first and second narrow gaps 112, 212 with respect to each other and with respect to the first and second spacer elements 113, 114, can be appropriately adapted as it is described in detail below.

In the following, the distance d1 describes the distance between (the adjacent edges of) the first narrow gap 112 and the first spacer element 113 (with respect to a vertical projection), the distance d2 describes the distance between (the adjacent edges of) the second narrow gap 212 and the second spacer element 114 (with respect to a vertical projection), wherein the distance d3 describes the distance between (the adjacent edges of) the first and second narrow gaps 112 and 212 (with respect to a vertical projection and assuming an essentially constant distance between the first and second narrow gaps). The distances are also shown in FIG. 5c below.

The following evaluations will further show that the specifically selected values for the distances d1, d2 and d3 will be made with respect to a tradeoff between the necessary robustness of the resulting counter electrode structure 108 and the resulting parasitic capacitances originating from the counter electrode structure 108. To be more specific, the greater and equal the chosen distances d1 and d2 are, the smaller are the resulting parasitic capacitances which originate from the first and second conductive layers 110, 210. However, in the same relation, if the distances d1 and d2 are increased, then the resulting useful capacitances CA, CB decrease due to the accordingly reduced (active) area of the displaceable portion 102a of the first membrane element 102 and of the displaceable portion 104a of the second membrane element 104. Moreover, the greater the distance d3 is between the first and second narrow gaps 112, 212, the greater is the resulting mechanical robustness of the counter electrode structure 108, however having asymmetric electrical properties of the first and second conductive layers 110, 210.

As the circumferential narrow gap 112 in the first conductive layer 110 is, with respect to a vertical projection, laterally offset to the circumferential narrow gap 212 of the second conductive layer 210, the first and second narrow gaps 112, 212 in the first and second conductive layers 110, 210 are arranged in non-overlapping configuration.

FIG. 4b shows a schematic cross-sectional view of a vacuum MEMS microphone 200 comprising a segmented counter electrode structure 108 having two segmented conductive layers 110, 210. To be more specific, the illustration of the vacuum MEMS microphone of FIG. 4b differs from the illustration in FIG. 3a-c in that the segmented counter electrode structure 108 comprises two segmented conductive layers 110, 210 in contrast to the one segmented conductive layer 110 of FIG. 3*a-c*. Thus, the explanations in the context of FIG. 3*a-c* are equally applicable to the arrangement of FIGS. 4*a-b* which has a counter electrode structure 108 with two electrically isolated/insulated conductive layers 110, 210, for example.

Figure 5A:
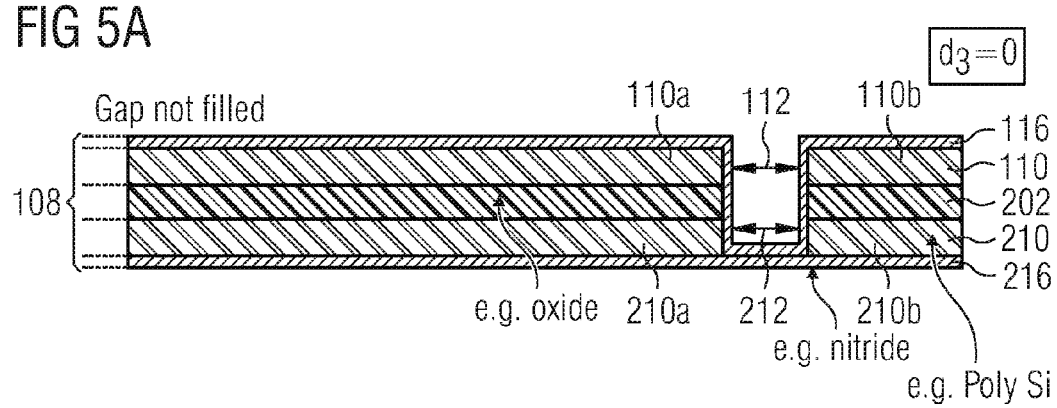
FIGS. 5a-c show schematic partial cross-sectional views of the counter electrode structure of FIGS. 4a-b and the resulting parasitic capacitances between the segmented first and second conductive layers.
Figure 5B:
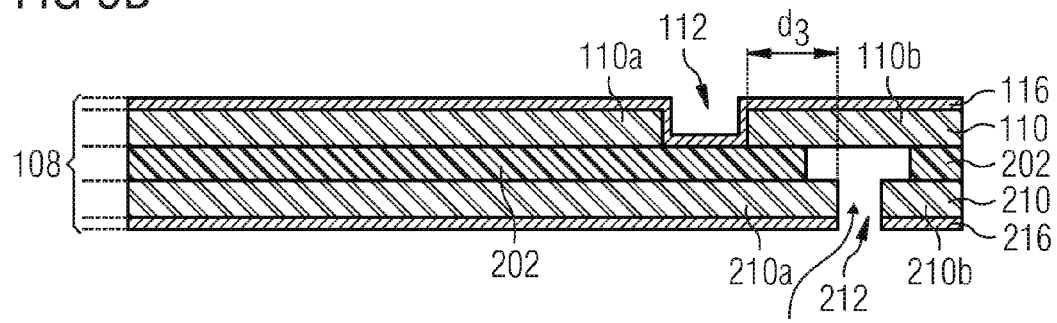
Figure 5C:
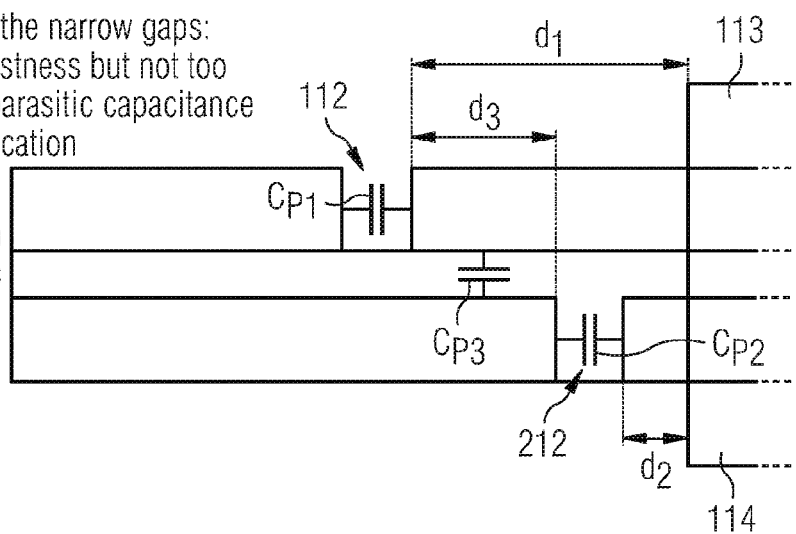

FIGS. 5*a-b* show schematic partial cross-sectional views of exemplary segmentation areas of the counter electrode structure 108 of FIGS. 4*a-b*.

As shown in FIG. 5*a*, the segmentation is a gap 112, 212 through the first and second conductive layers 110, 210 and the insulating layer 202. Thus, the distance d3 between (the adjacent edges of) the first and second narrow gaps 112 and 212 is zero. As shown in FIG. 5*a*, the gap 112 is essentially not filled as only the thin (optional) insulating layer 116 covering the first main surface of the first conductive layer 110 and the surface of the gap 112. Moreover, a further (optional) insulating layer 216, which may comprise a nitride material, may be arranged on the main surface area of the second conductive layer 210. The thickness of the first and second optional insulating layers 116, 216 may be chosen for achieving a sufficient mechanical strength or robustness of the resulting counter electrode structure 108.

FIG. 5*b* shows a configuration wherein the first and second circumferential narrow gaps 112, 212 are laterally offset (by the distance d3) to each other. The first main surface area of the first conductive layer 110 and the circumferential narrow gap 112 may be covered with the optional insulating layer 116. Moreover, the second circumferential narrow gap 212 may extend to the second conductive layer 210 and at least partially into/through the isolating layer 202. In this configuration of FIG. 5*b*, the insulating layer 202 is partially interrupted. This structure of the second circumferential gap 212 with the partially interrupted insulating layer 202 can be achieved by etching the insulating layer 202 during the release etch of the cavity 106 in the substrate under the MEMs device, i.e. the vacuum MEMS microphone.

For example, the etching of the insulating layer 202 may be performed while the material is etched which is present within the cavity 106 defined by the two membranes. The backside cavity 128 may be etched later (than the etching of the insulating layer 202), and the etching of the backside cavity 128 does not interfere with insulating layer 202.

The at least partial removal of the material of the insulating layer 202 performing the second circumferential narrow gap 212 provides a lower parasitic capacitance at the level of the second narrow gap 212 compared to the case in which it is filled with an oxide material.

FIG. 5*c* schematically shows the resulting and remaining (most dominant) parasitic capacitances CP1-3 caused by the segmented first and second conductive layers 110, 210. Due to the segmentation of the first and second conductive layers 110, 210 and the electrical connection between the second portion 110*b* of the first conductive layer 110 to the first membrane element 102, and of the second portion 210*b* of the second conductive layer to the second membrane element 104, the resulting parasitic capacitances can be greatly reduced since the isolated (separated) portions 110*b*, 210*b* of the first and second conductive layers 110, 210 only marginally contribute to the creation of parasitic capacitances. The resulting reduced capacitances are CP1 between the first and second portions 110*a*, 110*b* of the first conductive layer, CP2 between the first and second portions 210*a*, 210*b* of the second conductive layer 210, and CP3 between the second conductive portion 110*b* of the first conductive layer 110 and the first portion 210*a* of the second conductive layer.

The distance d1 describes the distance between (the adjacent edges of) the first narrow gap 112 and the first spacer element 113 (with respect to a vertical projection), the distance d2 describes the distance between (the adjacent edges of) the second narrow gap 212 and the second spacer element 114 (with respect to a vertical projection), wherein the distance d3 describes the distance between (the adjacent edges of) the first and second narrow gaps 112 and 212 (with respect to a vertical projection and assuming an essentially constant distance between the first and second narrow gaps).

The parasitic capacitance CP3 is based on the shift (distance d3) between the first and second narrow gaps 112, 212. As an increased distance d3 provides for an increased mechanical robustness of the resulting counter electrode structure 108, the distance d3 should be chosen as small as possible to limit the parasitic capacitance CP3 between the second portion 110*b* of the first conductive layer and the first portion 210*a* of the second conductive layer as indicated in FIG. 5*c*.

In the following, an exemplary relationship between the distances d1, d2 and d3 and the resulting parasitic capacitances CP1, CP2 and CP3 is described. For example, the parasitic capacitance Cp1 is essentially proportional to the width and length of the narrow gap 112, the thickness of layer 110 and the dielectric coefficient of the material at the level of gap 112. The same applies for the parasitic capacitance Cp2. The parasitic capacitances Cp1 and Cp2 may be typically >0.1 pF. For example, the parasitic capacitance Cp3 is proportional to the distance d3, the length of segmentation line (so it depends on the size of the central part 110*a* in this way) and the dielectric coefficient of the material of the insulating layer 202. For example, for a 1 mm square counter electrode structure 108 and a distance d3 of 4 µm, the parasitic capacitance Cp3 is in the order of 1 pF (versus a 5 to 10-times higher parasitic capacitance without segmentation).

As the resulting signal-to-noise ratio of the output signal of the MEMS device 100 depends on the following relation 1/(1+c0/cp), it becomes clear that an increased useful capacitance C0 and a reduced parasitic overall capacitance CP, which is based on a combination of CP1, CP2 and CP3, results in an increased signal-to-noise ratio SNR.

In the following, some exemplary and typical dimensions and materials of the different elements as described with respect to FIGS. 1*a-b*, 2*a-e*, 3*a-c*, 4*a-b* and 5*a-c* are described below.

The first membrane element 102 may be formed as conductive layer comprising poly-silicon, wherein the layer may have a thickness in the range of 0.5 µm, typically from 0.1 to 2 µm, from 0.2 to 1 µm, or from 0.3 to 0.7 µm. The second membrane element 104 may be formed as conductive layer comprising poly-silicon, wherein the layer may have a thickness in the range of 0.5 µm, typically from 0.1 to 2 µm, from 0.2 to 1 µm, or from 0.3 to 0.7 µm.

The first conductive layer 110 may be formed as conductive layer comprising poly-silicon, wherein the layer may have a thickness in the range of 0.5 µm, typically from 0.1 to 2 µm, from 0.2 to 1 µm, or from 0.3 to 0.7 µm. The second conductive layer 210 may be formed as conductive layer comprising poly-silicon, wherein the layer may have a thickness in the range of 0.5 µm, typically from 0.1 to 2 µm, from 0.2 to 1 µm, or from 0.3 to 0.7 µm.

The thickness of the first and second spacer elements 113, 114 and thus the distance between the first membrane element 102 and the counter electrode structure 108 and between the second membrane element 104 and the counter electrode structure 108 (i.e. the gaps between the movable parts and the static electrodes) is in the range of 2 µm, typically between 0.5 and 5 µm, between 1 and 3 µm, or between 1.5 and 2.5 µm.

The thickness of the insulating layer 202, which may comprise an oxide material, between the first and second conductive layers 110 and 210 (i.e. between the two static electrodes 110, 210) is in the range of 0.3 µm, and typically between 0.1 to 1 µm, between 0.2 to 5 µm, or between 0.25 to 0.35 µm. The oxide material may be, for example, silicon dioxide $SiO_2$.

The thickness of the first and second optional layer 116, 216 at least partially covering the first conductive layer 110 and the second conductive layer 210, respectively (i.e. on top and below the static electrodes stack), is in the range of 0.1 µm, and typically between 0.03 to 0.3 µm, between 0.05 to 0.2 µm, or between 0.07 to 0.13 µm. The optional insulating layers 116, 216 may comprise silicon nitride (SiN).

The first and second membrane elements 102, 104 and the counter electrode structure, i.e. the movable and static membranes/layers, may have (circumferential) geometrical shapes like a circle, oval, square, rectangle, and may have lateral dimensions (a mean external diameter) in the range of 1 mm, and typically between 0.1 to 5 mm, between 0.5 to 2 mm, or between 0.8 to 1.5 mm.

The narrow gaps 112, 212 are (preferably) located outside the anchored area (i.e. the anchoring area of the first and second spacer elements 113, 114), wherein the distance (d1 or d2) between (adjacent edges of) the outer narrow gap and the associated anchoring area (i.e. the first spacer element with respect to the first conductive layer 110, and the second spacer element 114 with respect to the second conductive layer 210) can be in the typical range of 10 µm, typically between 1 und 20 µm, between 5 und 15 µm, or between 8 und 12 µm, but can also vary from 1 µm to half of the radius of the respective membrane element 102, 104, for example.

At least one or both narrow gaps 112, 212 can also be located inside the anchoring area, i.e. with respect to a lateral projection, below (under) the first or second spacer element 113, 114. However, such an arrangement of the first and/or second narrow gap 112, 212 may provide an increased mechanical robustness of the resulting counter electrode structure but may result in increased parasitic capacitances.

In the following some typical dimensions of the narrow gaps 112, 212 are discussed with respect to the resulting influence on the remaining parasitic capacitances. The lateral dimensions of the narrow gaps 112, 212 are typically in the range between 0.1 and 10 µm, between 1.0 and 8 µm, or between 3 and 5 µm. The lateral dimension of the narrow gaps describes the distance between the first and second portions 110a-110b, 210a-210b of the first and second conductive layers 110, 210. The lateral dimensions of the first and second narrow gaps are chosen sufficiently large enough in order to minimize the remaining parasitic capacitances CP1 or CP2. The first and second narrow gaps 112, 212 in the first and second conductive layers 110, 210 may be, with respect to a vertical projection to the counter electrode structure 108, laterally offset to each other, i.e. may be arranged in a non-overlapping configuration.

Such a non-overlapping configuration of the two narrow gaps 112, 212 enables to avoid any mechanical weak point of the resulting counter electrode structure 108. However, the lateral shift (distance d3) should be as minimal as possible in order to reduce the remaining parasitic capacitance CP3. Thus, a typical dimension for the distance d3 is in the range of a few micrometers. The two narrow gaps 112, 212 can be located, with respect to a vertical projection, inside the anchoring area, which is formed by the first and second spacer elements 113, 114. However, to reduce the resulting parasitic capacitances CP1, CP2 at least one of the two narrow gaps 112, 212 should be located outside the anchoring area 115, 117.

In order to provide a balance between the remaining parasitic capacitance CP3 between the first and second conductive layers 110, 210, the distance d3 between the first and second narrow gap 112, 212 can be "inverted" as indicated below in FIG. 6b, for example.

To avoid any crossing of the first and second narrow gaps 112, 212 (with respect to a vertical projection), the inversion of shift (of the distance d3) can be done at the level of a hole in the respective electrode (the first or second conductive layer 110, 210) or at the border of the electrode (the first or second conductive layer 110, 210), for example where the respective electrode is anchored. In case of holes in the electrodes (first and/or second conductive layers 110, 210, for example for release purposes), the respective narrow gap 112, 212 (segmentation) should avoid these holes with a distance of typically or at least 0.5 µm. The shape of segmentation line can be adapted to avoid the holes, e.g. by means of a sinusoidal form of the segmentation line (narrow gap).

Figure 6A:
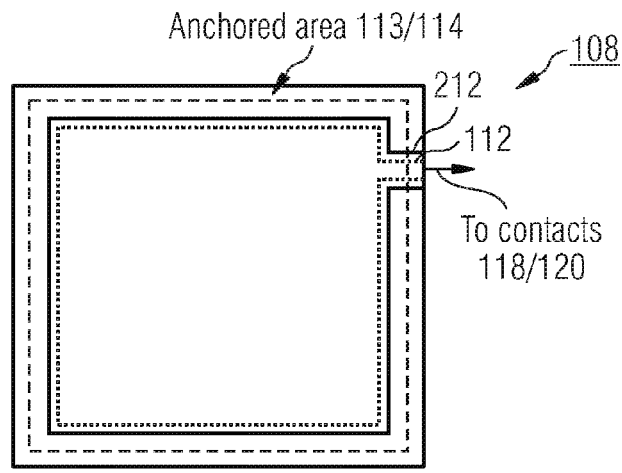
FIGS. 6a-c show schematic plane views of the segmented counter electrode structure comprising laterally offset segmentation grooves in the first and second conductive layer.
Figure 6B:
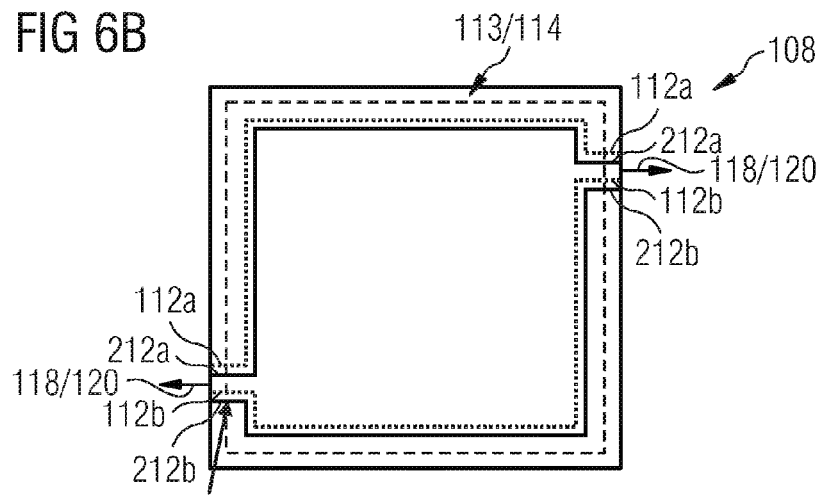
Figure 6C:
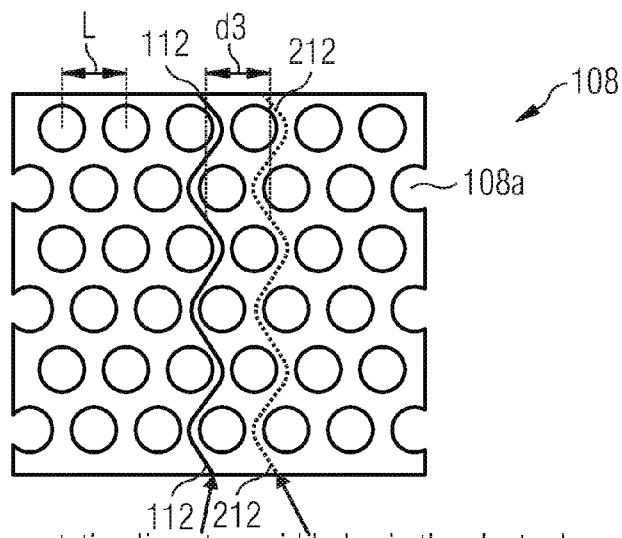

FIGS. 6a-c show schematic plane views of the segmented counter electrode structure 108 or of a portion thereof comprising laterally offset segmentation grooves/gaps 112, 212 in the first and second conductive layer 110, 210.

As shown in FIGS. 6a and 6b, the (nearly closed) circumferential narrow gap 112 in the first conductive layer 110 is, with respect to a vertical projection to the circumferential narrow gap 212 in the second conductive layer 210, laterally offset to the circumferential narrow gap 212 in the second conductive layer 210. Thus, the first and second circumferential narrow gaps 112, 212 in the first and second conductive layers are arranged in a non-overlapping configuration (with respect to a vertical projection of the circumferential narrow gap 112 in the first conductive layer 110 onto the circumferential narrow gap 212 in the second conductive layer 210). Thus, a non-intersecting configuration of the first and second circumferential narrow gaps 112, 212 in the first and second conductive layers 110, 210 is achieved.

With respect to FIGS. 6a-c it should be noted that the indicated circumferential narrow gaps 112, 212 are located in different (vertically offset) planes with respect to the drawing planes of FIGS. 6a-c. The anchored area defines the area of the spacer elements 113, 114 between the first membrane element 102 and the counter electrode structure 108, and between the second membrane element 104 and the counter electrode structure 108.

As shown in FIG. 6a, the connection elements 118, 120 (i.e. the wiring to the respective first and second membrane elements 102, 104) are located at the same side area of the counter electrode structure 108.

As shown in FIG. 6b, the counter electrode structure 108 comprises two contacting areas at two diagonally opposite positions of the counter electrode structure 108. Based on this configuration of FIG. 6b, the first circumferential narrow gap 112 may be divided in a first and second partial gap 112a, 112b, and the second circumferential narrow gap 212 may be divided in a first and second partial gap 212a, 212b. As the first narrow gaps 112a, 212a are arranged in "mirrored configuration" with respect to the respective distance to the anchoring area 115, 117 or with respect to the border of the counter electrode structure 108, and due to the mirrored configuration of the second partial gaps 112b, 212b with respect to each other, the remaining parasitic capacitances between the first and second conductive layer can be (essentially) balanced. To be more specific, a "shift inversion" of the first and second circumferential narrow gaps 112 (=112a+112b), 212 (=212a+212b) with respect to the border of the counter electrode structure is formed to balance the remaining parasitic capacitances.

As shown in FIG. 6c with respect to an enlarged partial view of the counter electrode structure 108, openings or holes 108a may be provided in at least one of the first and second conductive layers 110, 210. The holes 108a in the first and/or second conductive layers 110, 210 may be provided due to stress relief reasons, for example. In order to avoid an undesired decrease of the mechanical robustness of the resulting counter electrode structure 108, the first and second circumferential narrow gaps 112, 212 may have a course, e.g. a sinus-like course, to avoid connecting or intersecting the hole(s) 108a in the first and/or second conductive layers 110, 210 of the counter electrode structure 108. As shown in FIG. 6c, the first and second (vertically offset) circumferential narrow gaps 112, 212 are arranged as sinus-like segmentation lines. It should be noted that any further appropriate shape, e.g. zig-zag etc, of the respective segmentation lines can be chosen and adapted in that to avoid that the first and/or second circumferential narrow gap 112, 212 contacts or intersects at least of the plurality of the holes in the counter electrode structure 108. Thus, the distance d3 between the first and second narrow gap 112, 212 should be greater than the diameter of the holes 108a and smaller than the length L (which is the diameter of the holes 108a plus the distance between the holes 108a).

The above explanations with respect to the shape of the segmentation line in the first and/or second conductive layer 110, 210 is correspondingly applicable to the case when a segmentation is provided in the first and/or second membrane elements 102, 104 as it will be described below with respect to FIGS. 8a-b.

FIGS. 7a-d show different schematic circuit diagrams illustrating different, exemplary read out configurations for the above described MEMS device 100 (vacuum MEMS microphone).

FIG. 7a shows a schematic circuit diagram illustrating a further exemplary read out configuration for the MEMS device 100, having a counter electrode structure 108 with one active conductive layer 110.

As shown in FIG. 7a, the first portion 110a of the first conductive layer 110 is connected with a potential V1 so that the first portion 110a is polarized with the voltage V1. The movable structure 102, 104, i.e. the first and second membrane elements 102, 104, are read out by a differential amplifier 306, wherein the first and second membrane elements 102, 104 are each connected to a different input connection of the differential amplifier 306, which provides the output signal SOUT. Thus, FIG. 7a provides a differential read out configuration for a vacuum MEMS microphone having one conductive layer.

With respect to the configuration of FIG. 7a, it should be noted that the pillars 122 (not shown in FIG. 7a) which are mechanically coupled between the first and second membrane elements 102 and 104 for providing a mechanical coupling between the first and second membrane elements 102, 104 should not provide an electrical connection between the first and second membrane elements 102, 104 for allowing the differential read out configuration of the first and second membrane elements 102, 104. Thus, the pillars 122, which ensure a mechanical coupling between the first and second membrane elements 102, 104, do not provide an electrical connection between the two membrane elements, wherein the pillars 122 can be made of an insulating material, like silicon, nitride, silicon oxide, a polymer or a combination of the former materials, or a combination of the former materials with a conductive layer (for instance silicon), provided the conductive part of the pillars is separated from the membrane elements 102, 104 by an insulating material.

With respect to a differential read out configuration of a vacuum MEMS microphone 100 having a single conductive layer 110 as the counter electrode structure 108, it should be noted that the (single) conductive layer 110, i.e. the counter electrode, is split in an outer part 110b and an inner part 110a, wherein the outer part 110b comprises two electrically isolated portions 110b-1, 110b-2. Thus, the electrically isolated outer parts 110b-1, 110b-2 of the single conductive layer are respectively electrically connected to one of the movable membrane elements 102, 104 to avoid a shorting of the two membrane elements 102, 104. By biasing the inner part 110a of the counter electrode 110, the two membrane elements 102, 104 can be differentially read out.

As an alternative and possible implementation, the movable membrane element 102 may be electrically connected to the outer part 110b of the single conductive layer 110 (e.g. in one part), wherein the further membrane element 104 is not electrically connected to the outer part 110b of the single conductive layer 110. As a further possible implementation, the movable membrane element 104 may be electrically connected to the outer part 110b of the single conductive layer 110 (e.g. in one part), wherein the further membrane element 102 is not connected to the outer part 110b of the single conductive layer 110.

FIG. 7b schematically illustrates an example of how the MEMS microphone may be electrically connected to a power supply circuit and a read out amplifier. FIG. 7b shows an example of a possible connection, wherein other arrangements and configurations may be possible as well.

In FIG. 7b the first and second membrane elements 102, 104 may be connected (e.g. grounded) by a membrane connection 302 to an electric reference potential VREF (e.g. ground potential). The first portion 110a of the first conductive layer may be electrically connected to a first connection 304 to a first power supply circuit 307 and also to a first input of an amplifier 306. The first power supply circuit 307 comprises a voltage source 308 (providing a first potential V1) and a resistor 310 having a very high resistance (several Giga-Ohms or higher). The amplifier 306 may be a differential amplifier. The first portion 210a of the second conductive layer 210 may be connected to a second connection 312 to a second power supply circuit 313 and a second input of the amplifier 306. The second power supply circuit 313 comprises a second voltage source 314 (providing a second potential V2) and a second resistor 316 that typically has about the same resistance as the first resistor 310. The first and second power supply circuits 307, 313 electrically bias the first portions 110a, 210a of the first and second conductive layers 110, 210, respectively, against the electric reference potential VREF (e.g. ground potential).

When the membrane structure may be deflected in response to the arriving sound pressure, the electrical potentials at the first portions 110a, 210a of the first and second conductive layers 110, 210 may vary in opposite directions due to the varying capacitances CA, CB between the first membrane element 102 and the first portion 110a of the first conductive layer 110 and between the second membrane element 104 and the first portion 210a of the second conductive layer 210, respectively. This is schematically illustrated in FIG. 7b by a first waveform 317 and a second waveform 318 which may be fed in the first and second input, respectively of the amplifier 306. The amplifier 306 may generate an amplified output signal 320 based on the input signals at first and second connections 304 and 312, in particular a difference of the input signals. The amplified output signal 320 may then be supplied to further components for a subsequent signal processing, for example analog-to-digital conversion, filtering, etc.

Figure 7C:
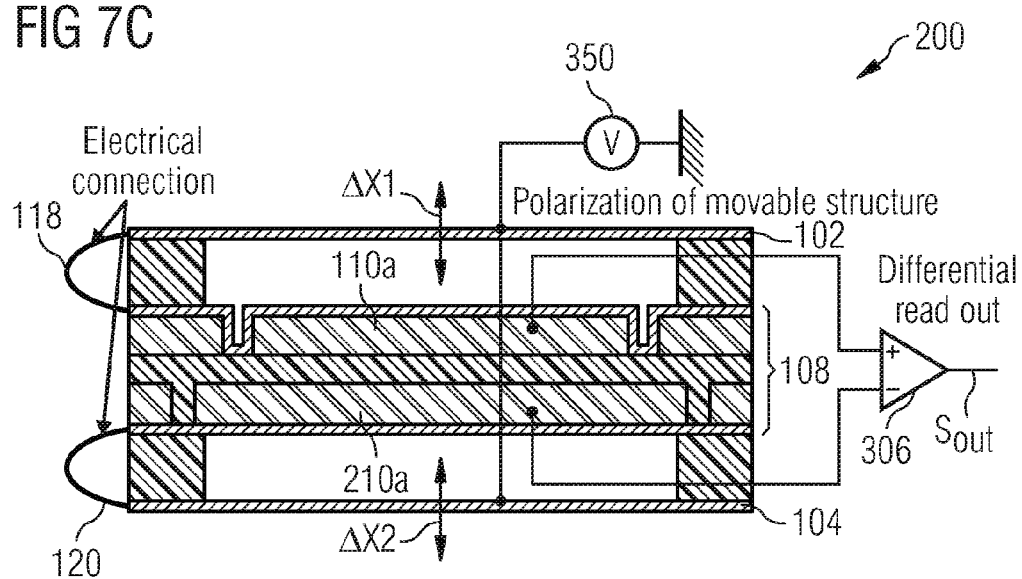

FIG. 7c shows a further schematic circuit diagram for a further exemplary read out configuration for the MEMS device 100. As shown in FIG. 7c, the first and second membrane elements 102, 104 are connected with a voltage source 350 to apply a reference potential V for the first and second membrane elements 102, 104. This provides a polarization with the potential V of the movable structure, i.e. the first and second membrane elements 102, 104. Furthermore, the first portions 110a, 210a of the first and the second conductive layers 110, 210 are respectively connected to different input connections of a differential amplifier 306 for providing a differential read out configuration of the MEMS device 100 (vacuum MEMS microphone). Thus, according to the configuration of FIG. 7c, a deflection of the membrane structure 102, 104 in response to an arriving sound pressure/sound signal, and corresponding output signal SOUT may be provided by the amplifier 306 indicative of the current deflection of the movable structure 102, 104.

Thus, the movable part 102, 104 (i.e. the first and second membrane elements 102, 104) are polarized with a voltage V1, wherein a differential sensing/read out is conducted on the static electrode 108, i.e. the first portions 110a, 210a of the first and second conductive layers 110, 210.

Figure 7D:
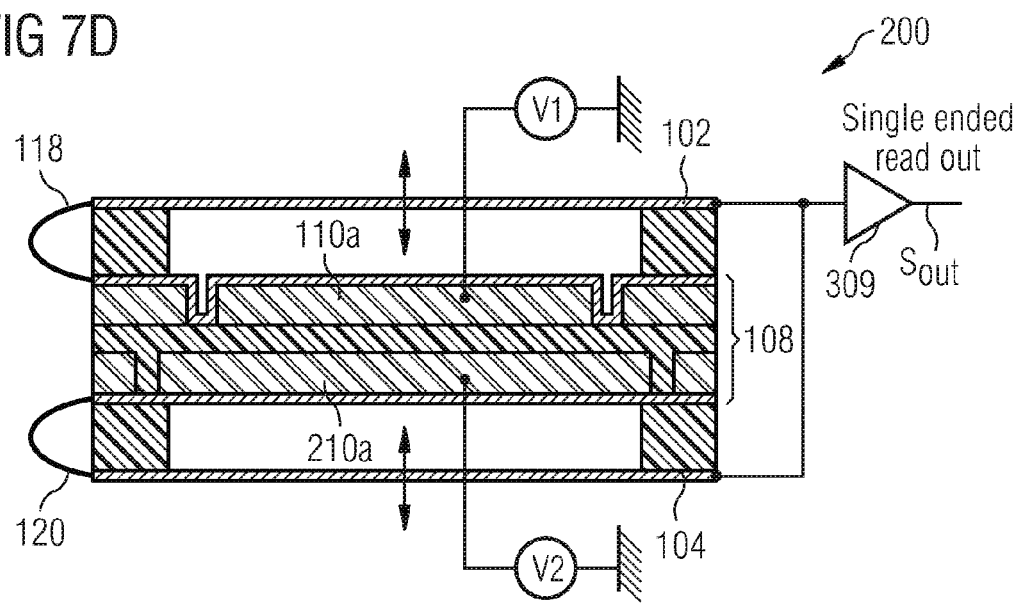

FIG. 7d shows a schematic circuit diagram of a further illustrative read out configuration for the MEMS device 100. To be more specific, as shown in FIG. 7d, the first portion 110a of the first conductive layer is connected to a first potential V1, i.e. is polarized with a first voltage V1, wherein the first portion 210a of the second conductive layer 210 is connected to a second potential V2, so that the first portion 210a of the second conductive layer is polarized with the second voltage V2.

The movable structure 102, 104, i.e. the first and second membrane elements 102, 104, are connected to a common input connection of a (single-ended) amplifier 309 for providing the amplified output signal SOUT based on a single-ended read out configured. Due to the polarization of the first portions 110a, 210a of the first and second conductive layer 110, 210, a deflection of the membrane structure 102, 104 results in electrical potentials at the first and second membrane elements 102, 104 which can be fed in a superimposed manner to an input of the amplifier 309.

To summarize, the two electrodes (the first portions 110a, 210a of the first and second conductive layers 110, 210) of the static membrane (the counter electrode structure 108) are polarized with different voltages V1, V2, for example to opposite voltages with V2=−V1. Thus, the movable structure can be read out based on a single-ended amplifier configuration (single-ended read out).

Figure 8A:
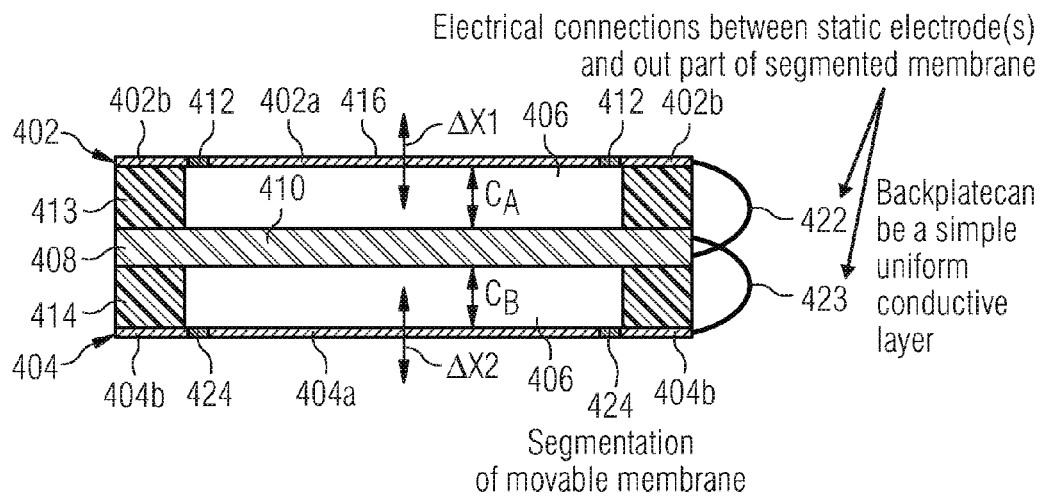
FIGS. 8a-b show schematic cross-sectional views of a vacuum MEMS microphone (MEMS loudspeaker or MEMS sound transducer) comprising a first and a second segmented membrane element.
Figure 8B:
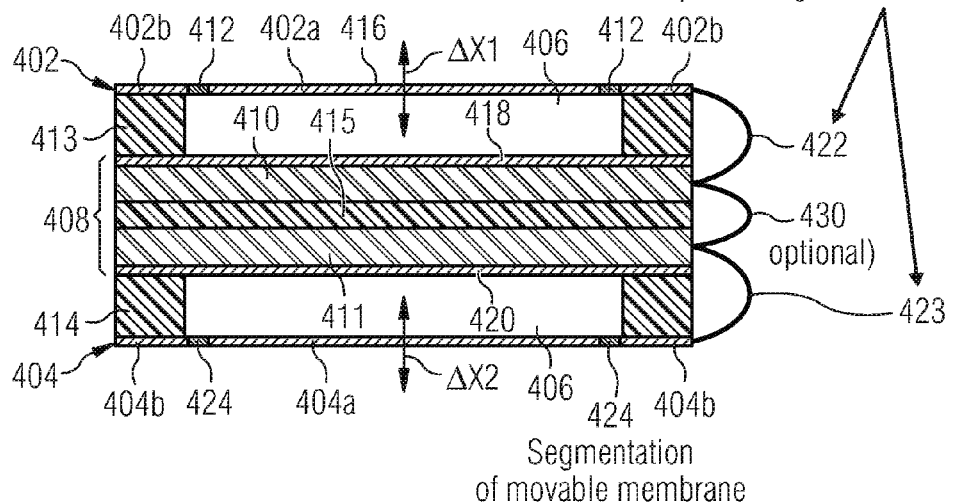

FIGS. 8a-b show schematic cross-sectional views of further exemplary MEMS devices, e.g. a MEMS sound transducer (a vacuum MEMS microphone or MEMS vacuum loudspeaker) comprising a first segmented membrane element 402 and a second segmented membrane element 404.

The MEMS device (vacuum MEMS microphone) 400 comprises a first membrane element 402, and a second membrane element 404, which is spaced apart from the first membrane element 402. A low pressure region 406 is located between the first and second membrane elements 402, 404, wherein the low pressure region 406 has a pressure less than an ambient pressure. A counter electrode structure 408 comprises a conductive layer 410 which is at least partially arranged in the low pressure region 406 or extends in the low pressure region 406. The first membrane element 402 comprises a segmentation 412 providing an electrical isolation between a first portion 402a of the first membrane element 402 and a second portion 402b of the first membrane element 402. The second membrane element 404 comprises a further segmentation 424 providing an electrical isolation between a first portion 404a of the second membrane element 404 and a second portion 404b of the second membrane element 404.

The segmentation 412 of the first membrane element 402 is a circumferential narrow gap in the first membrane element 402, wherein the segmentation 424 of the second membrane element 404 is a further (second) circumferential narrow gap in the second membrane element 404. The first portion 402a of the first membrane element 402 is a middle or center portion of the first membrane element 402, wherein the second portion 402b of the first membrane element 402 is a fringe/edge portion of the first membrane element 402. The first portion 404a of the second membrane element 404 is a middle or center portion of the second membrane element 404, wherein the second portion 404b of the second membrane element 404 is a fringe/edge portion of the second membrane element 404. As shown in FIG. 8a, the first membrane element 402 may be at least partially covered with or embedded in an isolating material 416, wherein the second membrane element 404 may also be covered with or embedded in a further insulating material 420.

The first portion 402b of the first membrane element 402 and the first portion 404b of the second membrane element 404 are electrically connected by a first and second connection 422, 423 with the conductive layer 410.

Thus, the connection elements 422, 423 provide electrical connections between the static electrode(s) 410 and the outer parts 402b, 404b of the segmented membrane 402, 404. As shown in FIG. 8a, the counter electrode structure 408 (backplate) can be a simple uniform conductive layer 410.

The MEMS device 400 may further comprise one or more pillars (not shown in FIGS. 8a-b) for mechanically coupling the first membrane element and the second membrane element 402, 404. In case of a counter electrode structure 408 having a single conductive layer 410, the pillars (not shown in FIG. 8a) ensure a mechanical coupling but not an electrical connection between the two membrane elements 402, 404. Thus, the pillars can be made at least partially of an insulating material.

Moreover, a first spacer element 413 is arranged between the first membrane element 402 and the counter electrode structure 408, wherein a second spacer element 414 is arranged is between the second membrane element 404 and the counter electrode structure 408. Furthermore, the circumferential narrow gap 412 in the first membrane element 402 is located outside the first spacer element 413, wherein the second circumferential narrow gap 414 in the second membrane element 404 is also located outside the second spacer element 414.

As shown in FIG. 8b, the counter electrode structure 408 may comprise a further conductive layer 411, wherein the second conductive layer 411 is electrically isolated from the first conductive layer 410 by means of an insulating layer 415.

The second portion 402b of the first membrane element 402 is electrically coupled, e.g. by means of a connection or wiring 422, with the first conductive layer 410, wherein the second portion 404b of the second membrane element 404 is electrically connected, e.g. by means of an electrical connection element or wiring, 423 to the second conductive layer 411. Moreover, an optional electrical connection 430 may be provided between the first and second conductive layer 410, 411.

Furthermore, the one or more pillars (not shown in FIG. 8b) which provide a mechanical coupling between the first and second membrane elements 402, 404 may also be electrically conductive for providing also an electric connection between the first and second membrane elements 402, 404, and especially between the first portions 402a, 404a of the first and second membrane elements 402, 404.

With respect to the vacuum MEMS microphone as shown in FIGS. 8a-b, it should be noted that the different read out configurations for the MEMS device 100 as shown in FIGS. 7a-d is correspondingly applicable to the vacuum MEMS microphones 400 as described with respect to FIGS. 8a-b.

With the exception of the specific segmentation of the counter electrode structure 108 of the MEMS device 100 and 200 (as shown in FIGS. 1-7) and of the membrane elements 402, 404 of the MEMS device 400 (as shown in FIGS. 8a-b), the characteristics, dimensions and materials of the elements of the MEMS device 400 (of FIG. 8a-b) are comparable to the elements of MEMS device 100 or 200 (of FIGS. 1-7). To be more specific, in the figures and the specification identical elements and elements having the same functionality and/or the same technical or physical effect are usually provided with the same reference numbers and/or with the same name, so that the description of these elements and of the functionality thereof as illustrated in the different embodiments are mutually exchangeable or may be applied to one another in the different embodiments.

Moreover, essentially the same or (at least) comparable read out configurations can be applied to the MEMS device 100 and 200 as shown in FIGS. 1-7, and to the MEMS device 400 as shown in FIGS. 8a-b. For example, when compared to the implemented read out configurations of FIGS. 7a-d, possible readout configurations of the MEMS device 400 in FIGS. 8a-b may (only) comprise an inversion (or exchange) between the membranes and counter electrode with respect to the respective connections thereof to the reference potential V and the read out circuit, for example.

For instance, for MEMS device 400 in FIG. 8a, the conductive layer 410 can be polarized, i.e. provided with a reference potential V, wherein the first and second membrane elements 402, 404 (not electrically connected) can be differentially read out. Alternatively, the first and second membrane elements 402, 404 can be polarized, i.e. provided with a reference potential V, wherein the conductive layer 410 can be single ended read out.

For the MEMS device 400 in FIG. 8b, the first and second membrane elements 402, 404 can be polarized, i.e. provided with a reference potential V, and can be electrically connected, wherein the first and second conductive layers 410, 411 (not electrically connected) can be differentially read out. Alternatively, for MEMS device 400 in FIG. 8b, the first and second conductive layers 410, 411 (not electrically connected) can be polarized differently, i.e. provided with different reference potentials V1, V2, wherein the first and second membrane elements 402, 404 (which can be electrically connected) can be single ended read out.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A MEMS device comprising:
   first membrane element,
   a second membrane element spaced apart from the first membrane element,
   a low pressure region between the first and second membrane elements, the low pressure region having a pressure less than an atmospheric pressure, and
   a counter electrode structure comprising a conductive layer, which is at least partially arranged in the low pressure region or extends in the low pressure region, wherein the conductive layer comprises a segmentation providing an electrical isolation between a first portion of the conductive layer and a second portion of the conductive layer.

2. The MEMS device according to claim 1, wherein the segmentation of the conductive layer is a circumferential narrow gap in the conductive layer.

3. The MEMS device according to claim 1, wherein the first membrane element comprises a displaceable portion and a fixed portion, wherein the second membrane element comprises a displaceable portion and a fixed portion, and wherein the first portion of the conductive layer is arranged between the displaceable portion of the first membrane element and the displaceable portion of the second membrane element.

4. The MEMS device according to claim 1, wherein the first portion of the conductive layer is a central portion of the conductive layer, and wherein the second portion of the conductive layer is a fringe portion of the conductive layer.

5. The MEMS device according to claim 1, wherein the second portion of the conductive layer is electrically coupled to the first membrane element and to the second membrane element.

6. The MEMS device according to claim 1, wherein the first and second membrane elements are mechanically coupled.

7. The MEMS device according to claim 1, wherein the first and second membrane elements are electrically connected.

8. The MEMS device according to claim 1, wherein one or more pillars are mechanically coupled between the first membrane element and the second membrane element.

9. The MEMS device according to claim 1, wherein the pressure in the low pressure region is substantially a vacuum.

10. The MEMS device according to claim 1, wherein the low pressure region is within a sealed cavity, which is formed between the first membrane element and the second membrane element.

11. The MEMS device according to claim 1, wherein the counter electrode structure comprises a further conductive layer, wherein a further segmentation provides an electrical isolation between a first portion of the further conductive layer and a second portion of the further conductive layer, and wherein the first portion of the further conductive layer is electrically isolated from the first portion of the first conductive layer.

12. The MEMS device according to claim 11, wherein one or more pillars are mechanically coupled between the first and second membrane elements, and wherein the one or more pillars are electrically conductive for providing a mechanical and electrical coupling between the first and second membrane elements.

13. The MEMS device according to claim 12, wherein the first portion of the further conductive layer is a central portion of the further conductive layer, and wherein the second portion of the further conductive layer is a fringe portion of the further conductive layer.

14. The MEMS device according to claim 12, wherein the first membrane element comprises a displaceable portion and a fixed portion, wherein the second membrane element comprises a displaceable portion and a fixed portion, wherein the first portion of the conductive layer faces the displaceable portion of the first membrane element, and wherein the first portion of the further conductive layer faces the displaceable portion of the second membrane element.

15. The MEMS device according to claim 12, wherein the second portion of the conductive layer is electrically connected to the first membrane element, and wherein the second portion of the further conductive layer is electrically connected to the second membrane element.

16. The MEMS device according to claim 12, wherein the segmentation of the further conductive layer is a circumferential narrow gap in the further conductive layer, and the segmentation of the conductive layer is a circumferential narrow gap in the conductive layer.

17. The MEMS device according to claim 16, wherein a first spacer element is arranged between the first membrane element and the conductive layer, wherein a second spacer element is arranged between the second membrane element and the further conductive layer, and wherein the circumferential narrow gap in the conductive layer is located outside the first spacer element, and the circumferential narrow gap in the further conductive layer is located outside the second spacer element.

18. The MEMS device according to claim 16, wherein the circumferential narrow gap in the conductive layer is, with respect to a vertical projection, laterally offset to the circumferential narrow gap in the further conductive layer.

19. The MEMS device according to claim 16, wherein the circumferential narrow gap in the conductive layer and the circumferential narrow gap in the further conductive layer are arranged in a non-overlapping configuration.

20. The MEMS device according to claim 16, wherein at least one of the circumferential narrow gap in the conductive layer and the circumferential narrow gap in the further conductive layer is completely filled with an isolating material.

21. The MEMS device according to claim 1, wherein the MEMS device is a MEMS microphone.

22. A MEMS device comprising:
a first membrane element,
a second membrane element spaced apart from the first membrane element,
a low pressure region between the first and second membrane elements, the low pressure region having a pressure less than an atmospheric pressure, and
a counter electrode structure comprising a first conductive layer which is at least partially arranged in the low pressure region or extends in the low pressure region,
wherein the first membrane element comprises a segmentation providing an electrical isolation between a first portion of the first membrane element and a second portion of the first membrane element, and
wherein the second membrane element comprises a further segmentation comprising an electrical isolation between a first portion of the second membrane element and a second portion of the second membrane element.

23. The MEMS device according to claim 22, wherein the segmentation of the first membrane element is a circumferential narrow gap in the first membrane element, and wherein the segmentation of the second membrane element is a circumferential narrow gap in the second membrane element.

24. The MEMS device according to claim 22, wherein the first portion of the first membrane element is a center portion of the first membrane element, and wherein the second portion of the first membrane element is a fringe portion of the first membrane element, and wherein the first portion of the second membrane element is a center portion of the second membrane element, and wherein the second portion of the second membrane element is a fringe portion of the second membrane element.

25. The MEMS device according to claim 22, wherein the first portion of the first membrane element and the first portion of the second membrane element are electrically coupled to the first conductive layer.

26. The MEMS device according to claim 22, wherein one or more pillars are mechanically coupled between the first membrane element and the second membrane element.

27. The MEMS device according to claim 22, wherein the counter electrode structure comprises a further conductive layer, which is electrically isolated from the first conductive layer, and wherein the second portion of the first membrane element is electrically connected to the first conductive layer, and wherein the second portion of the second membrane element is electrically connected to the further conductive layer.

28. The MEMS device according to claim 27, wherein one or more pillars are mechanically coupled between the first membrane element and the second membrane element, and wherein the one or more pillars are electrically conductive for providing a mechanical and electrical coupling between the first and second membrane elements.

29. The MEMS device according to claim 23, wherein a first spacer element is arranged between the first membrane element and the counter electrode structure, wherein a second spacer element is arranged between the second membrane element, and wherein the circumferential narrow gap in the first membrane element is located outside the first spacer element and the circumferential narrow gap in the second membrane element is located outside the second spacer element.

30. The MEMS device according to claim 22, wherein the MEMS device is a MEMS microphone.

* * * * *

UNITED STATES PATENT AND TRADEMARK OFFICE
CERTIFICATE OF CORRECTION

PATENT NO. : 9,828,237 B2
APPLICATION NO. : 15/066741
DATED : November 28, 2017
INVENTOR(S) : Walther et al.

Page 1 of 1

It is certified that error appears in the above-identified patent and that said Letters Patent is hereby corrected as shown below:

In the Claims

In Column 23, Line 7-8, Claim 11, delete "first portion of the first conductive layer" and insert --first portion of the conductive layer--.

Signed and Sealed this
Tenth Day of July, 2018

Andrei Iancu
*Director of the United States Patent and Trademark Office*